(12) United States Patent
Grant et al.

(10) Patent No.: US 11,680,310 B2
(45) Date of Patent: Jun. 20, 2023

(54) SYSTEMS FOR DEPOSITING COATINGS ON SURFACES AND ASSOCIATED METHODS

(71) Applicant: Continental Reifen Deutschland GmbH, Hanover (DE)

(72) Inventors: Andrew Grant, Jamaica Plain, MA (US); Michael E. Stazinski, Pembroke, MA (US); Hilton Pryce Lewis, Lexington, MA (US); Martin Klein, Bedford, MA (US); Ryan Spoering, Waltham, MA (US); W. Shannan O'Shaughnessy, Watertown, MA (US)

(73) Assignee: Continental Reifen Deutschland GmbH, Hanover (DE)

(*) Notice: Subject to any disclaimer, the term of this patent is extended or adjusted under 35 U.S.C. 154(b) by 685 days.

(21) Appl. No.: 15/977,481

(22) Filed: May 11, 2018

(65) Prior Publication Data

US 2018/0355475 A1    Dec. 13, 2018

Related U.S. Application Data

(60) Provisional application No. 62/505,781, filed on May 12, 2017.

(51) Int. Cl.
*C23C 14/50* (2006.01)
*C23C 16/458* (2006.01)
(Continued)

(52) U.S. Cl.
CPC ............... *C23C 14/50* (2013.01); *B05B 1/14* (2013.01); *B29C 33/56* (2013.01); *B29C 33/58* (2013.01); *B29C 33/62* (2013.01); *B29D 30/0662* (2013.01); *C23C 14/562* (2013.01); *C23C 16/30* (2013.01); *C23C 16/44* (2013.01); *C23C 16/458* (2013.01); *C23C 16/54* (2013.01); *C23C 16/56* (2013.01); *H01L 21/68764* (2013.01);
(Continued)

(58) Field of Classification Search
CPC ........................ H01L 21/68764; C23C 14/562
See application file for complete search history.

(56) References Cited

U.S. PATENT DOCUMENTS 5,146,481 A * 9/1992 Garg ..................... C23C 16/271
378/35
5,769,953 A * 6/1998 Yoshikawa ........... B08B 7/0035
264/483

(Continued)

FOREIGN PATENT DOCUMENTS

CN        105039927 A     11/2015

OTHER PUBLICATIONS

International Search Report and Written Opinion for PCT/US2018/032262 dated Oct. 29, 2018.

(Continued)

*Primary Examiner* — Jeffrie R Lund
*Assistant Examiner* — Tiffany Z Nuckols
(74) *Attorney, Agent, or Firm* — Wolf, Greenfield & Sacks, P.C.

(57) ABSTRACT

Systems for depositing coatings onto surfaces of molds and other articles are generally provided. In some embodiments, a system is adapted and arranged to cause gaseous species to flow parallel to a filament array. In some embodiments, a system comprises one or more mold supports that are translatable.

23 Claims, 15 Drawing Sheets

(51) Int. Cl.
  *B29C 33/56* (2006.01)
  *B05B 1/14* (2006.01)
  *C23C 16/54* (2006.01)
  *C23C 16/44* (2006.01)
  *C23C 16/30* (2006.01)
  *C23C 16/56* (2006.01)
  *B29C 33/62* (2006.01)
  *B29D 30/06* (2006.01)
  *B29C 33/58* (2006.01)
  *C23C 14/56* (2006.01)
  *H01L 21/687* (2006.01)
  *B05D 1/00* (2006.01)
  *B05D 5/08* (2006.01)
  *B05D 1/02* (2006.01)

(52) U.S. Cl.
  CPC ............... *B05D 1/02* (2013.01); *B05D 1/60* (2013.01); *B05D 5/08* (2013.01); *B05D 2518/10* (2013.01)

(56) References Cited

U.S. PATENT DOCUMENTS

| | | | |
|---|---|---|---|
| 5,888,591 A | 3/1999 | Gleason et al. | |
| 6,338,620 B1* | 1/2002 | Yamada | B29D 30/0601 425/40 |
| 6,610,238 B1* | 8/2003 | Steidl | B29D 30/0662 425/38 |
| 8,916,001 B2 | 12/2014 | Pryce Lewis et al. | |
| 10,964,509 B2 | 3/2021 | Song | |
| 2007/0235890 A1* | 10/2007 | Pryce Lewis | C23C 16/46 264/39 |
| 2008/0041836 A1 | 2/2008 | Gralenski | |
| 2010/0294658 A1* | 11/2010 | Pei | C23C 14/35 204/298.18 |
| 2012/0003497 A1 | 1/2012 | Handy et al. | |
| 2013/0323423 A1* | 12/2013 | Nakaya | C23C 16/045 427/255.29 |
| 2013/0344247 A1* | 12/2013 | Ueyama | C23C 16/24 427/255.28 |
| 2015/0079211 A1* | 3/2015 | Satoh | B29D 30/0654 425/50 |
| 2017/0358445 A1 | 12/2017 | O'Shaughnessy et al. | |
| 2018/0211862 A1 | 7/2018 | Konkola et al. | |
| 2018/0366302 A1 | 12/2018 | Sun et al. | |
| 2020/0051789 A1 | 2/2020 | Linebarger, Jr. et al. | |
| 2021/0331197 A1 | 10/2021 | O'Shaughnessy et al. | |
| 2021/0331198 A1 | 10/2021 | O'Shaughnessy et al. | |
| 2021/0331202 A1 | 10/2021 | O'Shaughnessy et al. | |

OTHER PUBLICATIONS

International Search Report and Written Opinion for PCT/US2021/027394 dated Aug. 5, 2021.

* cited by examiner

SYSTEMS FOR DEPOSITING COATINGS ON SURFACES AND ASSOCIATED METHODS

RELATED APPLICATIONS

This application claims priority under 35 U.S.C. § 119(e) to U.S. Provisional Application No. 62/505,781, filed May 12, 2017, and entitled "Systems for Depositing Coatings on Surfaces and Associated Methods", which is incorporated herein by reference in its entirety for all purposes.

FIELD

Systems for depositing coatings onto surfaces of molds and related articles and methods are generally provided.

BACKGROUND

Coatings disposed on mold surfaces may have one or more beneficial features, such as facilitating the removal of parts from the molds. The coatings may be formed by methods involving polymerization of a gaseous species on the mold surface. However, these methods may result in the formation of uneven coatings and may result in waste of a portion of the reactants.

Accordingly, improved systems and methods for coating surfaces are needed.

SUMMARY

The present disclosure generally provides systems for depositing coatings onto surfaces of molds and related articles, and related methods. The subject matter described herein involves, in some cases, interrelated products, alternative solutions to a particular problem, and/or a plurality of different uses of one or more systems and/or articles.

In one aspect, systems for depositing coatings on surfaces of molds are provided. The system may comprise a deposition chamber, a mold support adapted and arranged to support the mold in the deposition chamber, a gas inlet port adapted and arranged to introduce a gaseous species into the deposition chamber, and a filament assembly. The filament assembly may comprise a first frame portion, a second frame portion, a third frame portion positioned between and connecting the first frame portion and the second frame portion, and a plurality of filaments extending between the first frame portion and the second frame portion to form a non-planar filament array. The filament array, the filament assembly, and the gas inlet may be positioned so to cause the gaseous species to flow in a direction substantially parallel to each of the plurality of filaments in the filament array.

In some embodiments, a system comprises a deposition chamber, a mold support adapted and arranged to support the mold in the deposition chamber, a gas inlet port adapted and arranged to introduce a gaseous species into the deposition chamber, and a filament assembly. The filament assembly may comprise a first frame portion, a second frame portion, a third frame portion positioned between and connecting the first frame portion and the second frame portion, and a plurality of filaments extending between the first frame portion and the second frame portion to form a non-planar filament array. The filament assembly may be positioned between the third frame portion and the mold support, the third frame portion may have approximately the same shape as the non-planar filament array, and/or the third frame portion may be positioned at a distance of between about 0.1 and 5.0 inches away from the filament array.

In some embodiments, a system comprises a deposition chamber adapted and arranged to contain a first mold or a second mold, a first mold support adapted and arranged to support the first mold, a second mold support adapted and arranged to support the second mold, a gas inlet port adapted and arranged to introduce a gaseous species into the deposition chamber, and a filament assembly. The first mold support may be translatable from a first position to a second position, and/or the second mold support may be translatable from a third position to the second position. In some embodiments, the second position is aligned with the deposition chamber. In some embodiments, the filament assembly comprises a first frame portion, a second frame portion, a third frame portion positioned between and connecting the first frame portion and the second frame portion, and a plurality of filaments extending between the first frame portion and the second frame portion to form a non-planar filament array.

Certain embodiments are related to methods for forming conformal coatings on a mold. In some embodiments, a method comprises flowing a gaseous species parallel to the plurality of filaments in a system and depositing a conformal coating onto the mold. The coating may comprise a polymer formed from the gaseous species.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
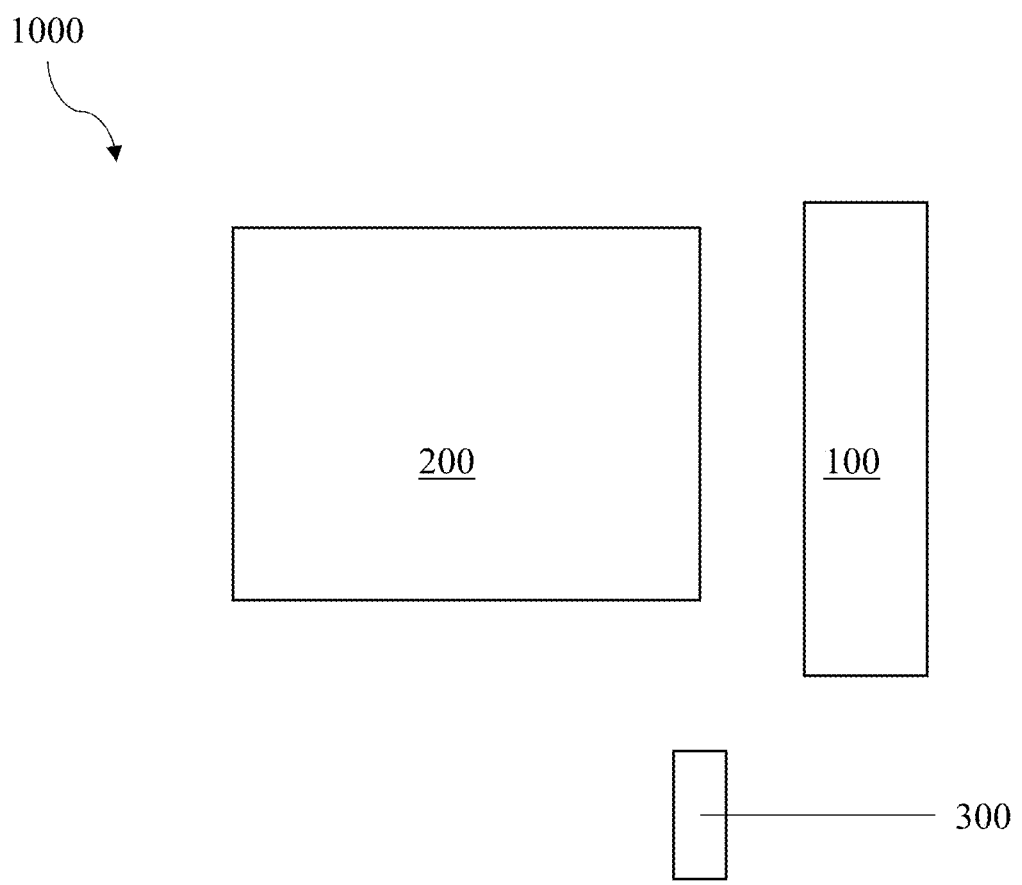
FIG. 1 shows a schematic depiction of a non-limiting embodiment of a system comprising a gas inlet port, a filament assembly, and a mold support.

Certain embodiments are related to systems for depositing coatings onto surfaces of molds. Some systems comprise a mold support, a gas inlet port, and a filament assembly comprising a plurality of filaments. In some embodiments, the mold support, gas inlet port, and filament assembly may be positioned to allow for advantageous flow of a gaseous species over the mold and the filament assembly. For example, the mold support, gas inlet port, and filament assembly may be positioned so as to cause the gaseous species to flow in a direction substantially parallel to each of the plurality of filaments. As a second example, the mold support, gas inlet port, and filament assembly may be positioned so as to cause a gaseous species to flow in a substantially vertical direction. As a third example, the filament array may be positioned between a frame portion of the filament assembly and the mold support, and/or may be positioned at a distance of between about 0.1 inches and about 5 inches from the filament array. As a fourth example, the filament array may be positioned between a frame portion of the filament assembly and the mold support, and/or may be positioned at a distance of between about 0.1 inches and about 5 inches from the frame portion of the filament assembly. In some embodiments, the mold support, gas inlet port, and filament assembly may be positioned to allow for flow of a gaseous species over a mold with a geometry that may otherwise be challenging to coat, such as a non-planar mold. For instance, one or more of the mold support, gas inlet port, and filament assembly may be non-planar, and/or may have substantially the same shape as the non-planar mold. In some embodiments, the mold support, gas inlet port, and filament assembly may be positioned so as to cause a gaseous species to flow in a direction substantially parallel to a surface of a non-planar mold and/or cause a gaseous species to flow substantially uniformly over a surface of a non-planar mold. Systems adapted and arranged to cause a gaseous species to flow in one or more of the manners described herein may promote the formation of coatings from the gaseous species that have high quality and/or high uniformity.

In some embodiments, a system for depositing a coating onto a surface of a mold may comprise one or more portions that may be translated between two or more positions. For instance, a system may comprise a mold support or mold supports that may be translated between a first position and a second position, and/or between a second position and a third position. Different positions may be adapted and arranged to be suitable for different operations performed during mold coating. For example, one or more positions may be suitable for preparing a mold to be coated, one or more positions may be suitable for depositing a coating onto a mold surface, and/or one or more positions may be suitable for removing a coated mold from the system. Some positions may be suitable for more than one function, such as being suitable for both preparing a mold to be coated and for removing a coated mold from the system. In some cases, a system comprising at least two mold supports that are translatable and may allow an operator to simultaneously prepare a mold for coating and coat a mold that has been prepared. For example, the operator may prepare a first mold for a coating process while it is disposed on a first mold support in a first position while performing a coating process on a second mold disposed on a second mold support in a second position. At the conclusion of the coating process, the operator may translate the second mold to a third position and the first mold to the second position. The operator may then coat the second mold while removing the first mold from the system and/or while preparing a third mold for coating. In cases where the time required preparation of a mold for coating and removal of a coated mold is on the order of or less than the amount of time required to coat the mold, substantial increases in efficiency and throughput may be obtained.

FIG. 1 shows an exemplary system 1000 for coating a mold, comprising mold support 100, filament assembly 200, and gas inlet port 300. In some embodiments, a system such as that shown in FIG. 1 may be employed to form a coating on a mold supported by a mold support 100 by introducing a gaseous species through gas inlet port 300, flowing it by filament assembly 200, thereby depositing a coating comprising a reaction product of the gaseous species on the mold. Individual components of the system and method steps are described herein. It should also be understood that the arrangement of system components may be different than that that depicted in FIG. 1, and that systems described herein may further comprise additional components not shown in FIG. 1 or may not comprise one or more of the components shown in FIG. 1.

Figure 2:
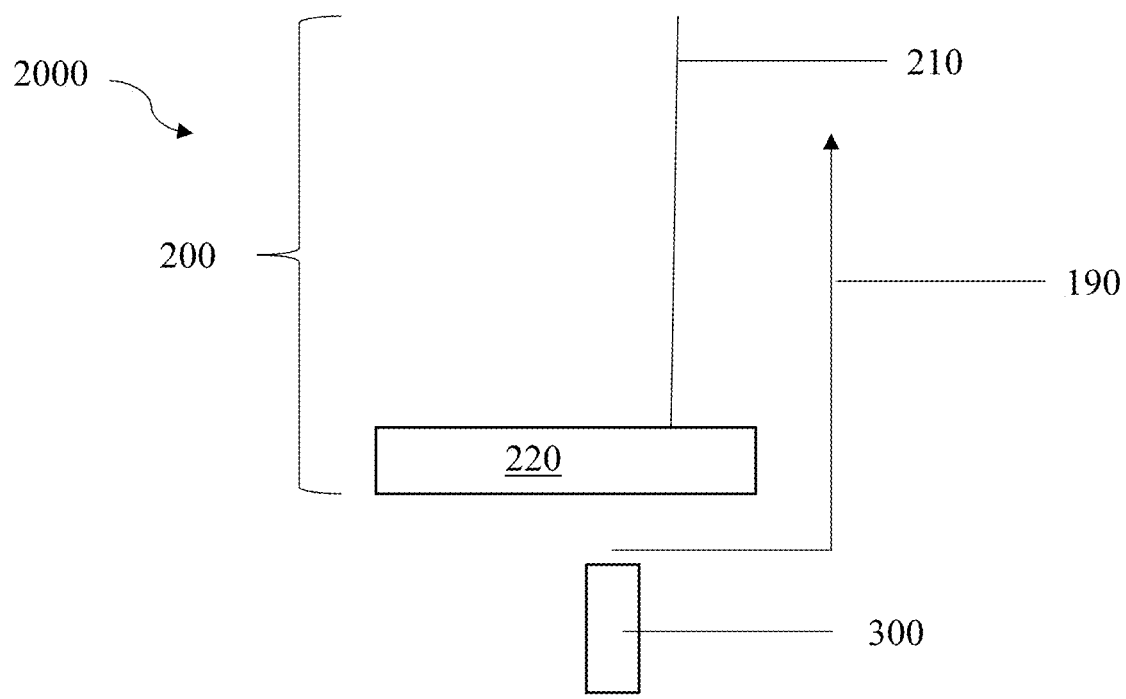
FIG. 2 shows a schematic depiction of a non-limiting embodiment of a system in which a gas inlet port and a filament assembly are positioned so as to cause a gaseous species to flow in a direction substantially parallel to the filaments in the filament assembly.

In some embodiments, a system may comprise a gas inlet port and a filament assembly comprising a plurality of filaments. The gas inlet port and the filament assembly may be positioned so as to cause a gaseous species to flow in a direction substantially parallel to each of the plurality of filaments. FIG. 2 shows a non-limiting embodiment of a system 2000 in which gas inlet port 300 and filament assembly 200 comprising filament 210 and first frame portion 220 are positioned so as to cause a gaseous species to flow in a direction substantially parallel to filament 210. As indicated by arrow 190, the gaseous species introduced by the gas inlet port may flow upwards to the bottom of the first frame portion. The first frame portion may block the gaseous species from flowing directly upwards, and/or may direct the gaseous species laterally. The gaseous species may then flow laterally across the bottom of the first frame portion until it reaches its edge. At this point, the gaseous species may once again flow upwards. If the plurality of filaments are oriented vertically, the upwardly flowing gaseous species will flow in a direction substantially parallel to each filament in the plurality of filaments.

Other positions of a filament assembly, components thereof, and a gas inlet port with respect to each other are also possible. For example, in some embodiments the plurality of filaments may be oriented horizontally instead of vertically.

Figure 3A:
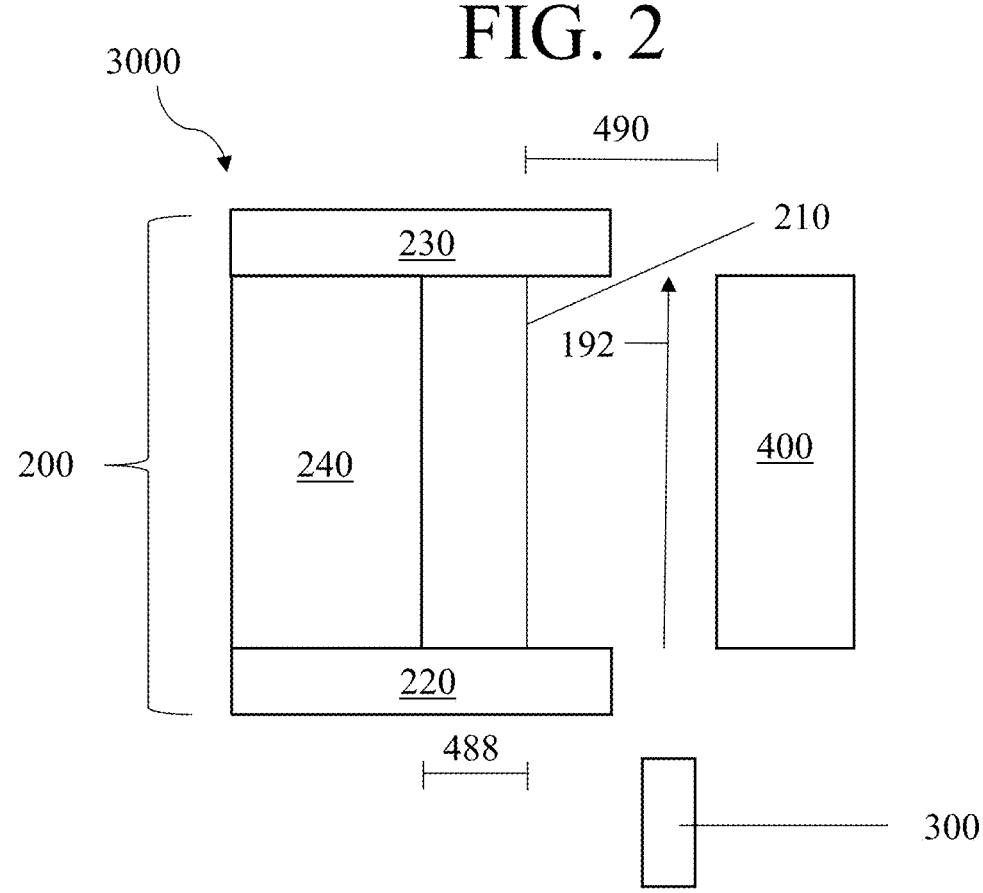
FIG. 3A shows a schematic depiction of a non-limiting embodiment of a system comprising a mold, a filament assembly, and a gas inlet port.
Figure 4:
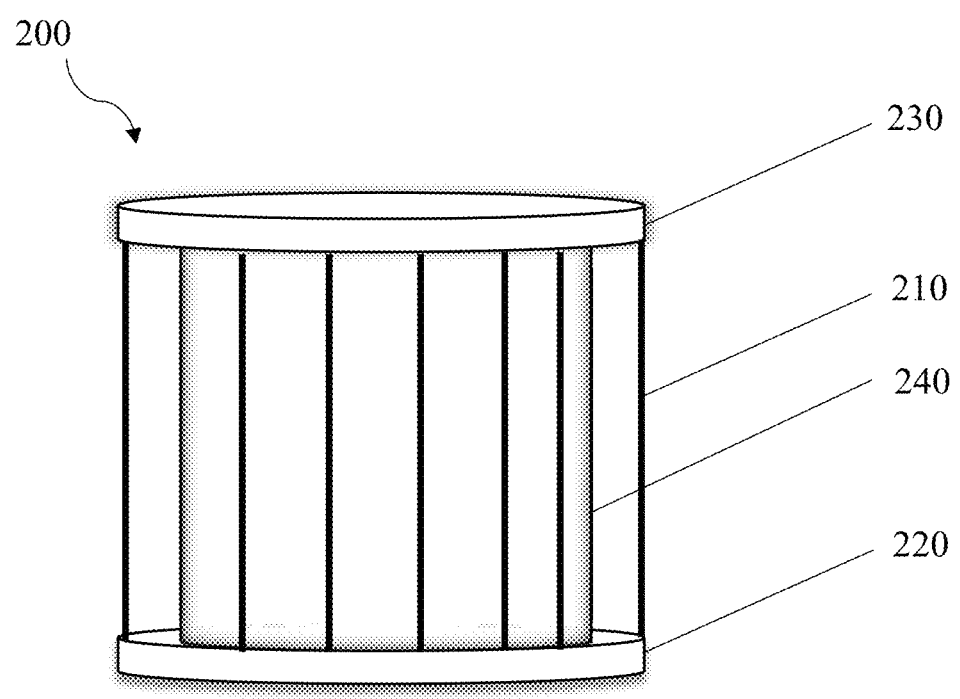
FIG. 4 shows a schematic depiction of a non-limiting embodiment of a filament assembly.

In some embodiments, a system may comprise a filament assembly comprising a first frame portion, a second frame portion, a third frame portion, and a plurality of filaments. The plurality of filaments may extend between the first frame portion and the second frame portion to form a filament array. The third frame portion may be positioned between the first frame portion and the second frame portion and/or may connect the first frame portion to the second frame portion. FIG. 3A shows a non-limiting embodiment of a system 3000 comprising mold 400, filament assembly 200, and gas inlet port 300. Filament assembly 200 comprises first frame portion 220, second frame portion 230, third frame portion 240, and filament 210. The third frame portion may be spaced a selected distance from the filament, such as distance 488 in FIG. 3A. In some embodiments, the plurality of filaments may be positioned between the third frame portion and the mold. In FIG. 3A, filament 210 is positioned distance 490 from the mold 400. This arrangement may cause a gaseous species present in the system to flow in an advantageous manner. For instance, the gaseous species may flow in a direction substantially parallel to the plurality of filaments, as shown by arrow 192 in FIG. 3A. In some embodiments, the gaseous species introduced by the gas inlet port may flow upwards across the filaments between the third frame portion and the mold. In some embodiments, a system as described herein may comprise a filament array that is non-planar. That is, there may not be a single plane in which all of the filaments in the filament array are disposed. For example, the filament array may be substantially cylindrical, substantially cuboid, or may have any other suitable shape. In some embodiments, the filament array may have substantially the same shape as a mold to be coated. For example, the mold may have a non-planar shape and the filament assembly may have substantially the same non-planar shape. Certain molds may be cylindrical, and may be coated in systems comprising cylindrical filament arrays. FIG. 4 shows one non-limiting embodiment of a filament assembly comprising a non-planar filament array that has a cylindrical shape. In this Figure, filament assembly 200 comprises filament array 210 extending between first frame portion 220 and second frame portion 230, and third frame portion 240. It should be appreciated that FIG. 4 is exemplary, and that other orientations of the filament array with respect to the filament assembly are also possible. For example, in some embodiments the filaments in the filament array may be oriented circumferentially around a cylindrical filament assembly. In some embodiments, the plurality of filaments may be oriented substantially perpendicular to one or more components of the filament assembly and/or the system, such as the first frame portion, the second frame portion, and/or a mold support.

It should be understood that while many of the embodiments described herein include filament arrays that are cylindrical, this is by no means limiting and a person of ordinary skill in the art would be able to apply the teachings described herein to other shapes.

In some embodiments, a system may comprise a filament array that is one component of a filament assembly. The filament assembly may comprise a first frame portion, a second frame portion, and a third frame portion in addition to the filament array. The third frame portion and/or the plurality of filaments may extend between the first frame portion and the second frame portion. For example, first frame portion and the second frame portions may be the end of a cylinder, the third frame portion may be the center of the cylinder, and the plurality of filaments may extend between the first frame portion and the second frame portion. In some embodiments, the third frame portion has a smaller radius than the circular shape formed by the plurality of filaments. The third frame portion may be solid, semi-solid, or may be hollow. For example, in some embodiments, the third frame portion may comprise a cylinder surface that extends between the first frame portion and the second frame portion, and the space inside the circular planar surface may be hollow. In other embodiments, the third frame portion may be solid.

In some embodiments, the filament assembly may comprise both a non-planar filament array and a non-planar third frame portion. For example, the filament assembly may comprise a third frame portion that has substantially the same shape as the non-planar filament array. In some such embodiments, the third frame portion may be positioned inside the non-planar filament array, or the non-planar filament array may surround the third frame portion. In some embodiments, the filament assembly may be positioned concentrically around the third frame portion.

Figure 5:
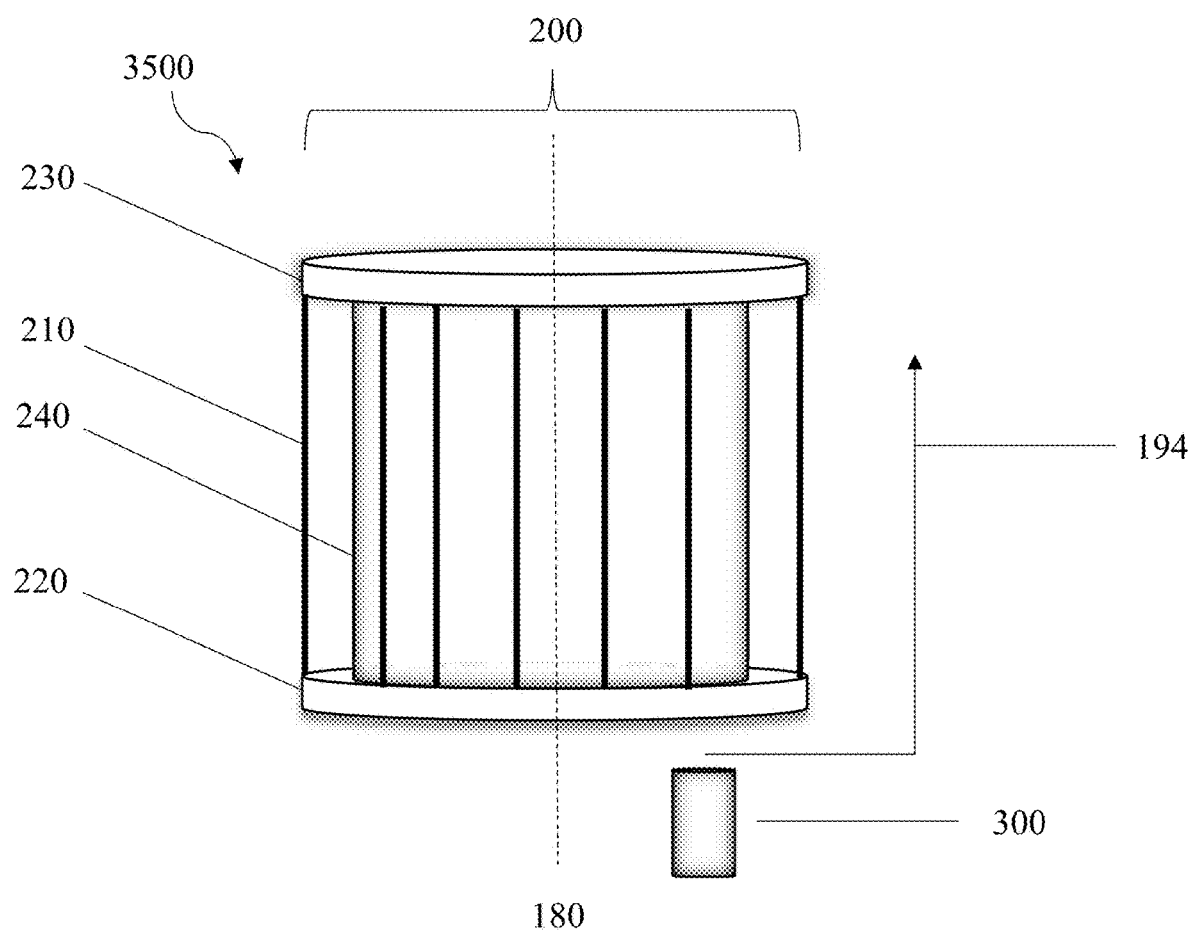
FIG. 5 shows a schematic depiction of a non-limiting embodiment of a system in which a filament assembly and a gas inlet port are positioned so as to cause a gaseous species to flow parallel to central axis of the filament array.

In some embodiments, a system may comprise a filament assembly and a gas inlet port that is positioned so as to cause a gaseous species to flow in a direction substantially parallel to a central axis of the filament array, or an axis around which the filaments in the array are symmetrically positioned. FIG. 5 shows one example of system 3500 in which filament assembly 200 and gas inlet port 300 are positioned so as to cause a gaseous species to flow parallel to central axis 180 of the filament array as shown by arrow 194. It should be noted that the filaments may have any orientation with respect to a central axis. For example, the filaments may be parallel to the central axis. Or, the filaments may wrap around the central axis concentrically. In some embodiments, as will be described further below, one or more additional portions of the system may also promote gas flow parallel to a central axis of the filament array or may together with the gas inlet port promote gas flow parallel to a central axis of the filament array. Such components may include molds, mold supports, baffles, and/or gas outlet ports.

In some embodiments, the third frame portion may be positioned at an advantageous distance from the filament array. In some embodiments, the third frame portion may be positioned at a distance of greater than or equal to 0.1 inches, greater than or equal to 0.2 inches, greater than or equal to 0.5 inches, greater than or equal to 1.0 inch, greater than or equal to 1.5 inches, greater than or equal to 2.0 inches, greater than or equal to 2.5 inches, greater than or equal to 3.0 inches, greater than or equal to 3.5 inches, greater than or equal to 4.0 inches, or greater than or equal to 4.5 inches on average for each filament of the filament array. In some embodiments, the third frame portion may be positioned at a distance of less than or equal to 5.0 inches, less than or equal to 4.5 inches, less than or equal to 4.0 inches, less than or equal to 3.5 inches, less than or equal to 3.0 inches, less than or equal to 2.5 inches, less than or equal to 2.0 inches, less than or equal to 1.5 inches, less than or equal to 1.0 inch, less than or equal to 0.5 inches, less than or equal to 0.4 inches, less than or equal to 0.3 inches, or less than or equal to 0.2 inches on average from each filament of the filament array. Combinations of the above-referenced ranges are also possible (e.g., greater than or equal to 0.1 inches and less than or equal to 5.0 inches, or greater than or equal to 1.5 inches and less than or equal to 5.0 inches). Other ranges are also possible. In some embodiments, each filament in the filament array may be positioned at a distance from the third frame portion that is substantially the same (e.g., the standard deviation of the distance between the third frame portion and the plurality of filaments in the filament array is less than or equal to 10%, less than or equal to 5%, less than or equal to 2%, or less than or equal to 1% of the distance between the third frame portion and the plurality of filaments). In some embodiments, different filaments in the filament array may be positioned at substantially different distances from the third frame portion.

In some embodiments, a system may comprise a mold and a filament assembly comprising a plurality of filaments forming a filament array, and the mold may be positioned at an advantageous distance from the filament array. In some embodiments, the filament array and the mold may have substantially the same shape. For example, both the filament array and the mold may be substantially cylindrical. In some embodiments, the filament array is positioned inside of the mold (e.g., the filament array has a smaller diameter than the mold). The mold may be positioned at a distance of greater than or equal to 0.1 inches, greater than or equal to 0.2 inches, greater than or equal to 0.3 inches, greater than or equal to 0.4 inches, greater than or equal to 0.5 inches, greater than or equal to 1.0 inch, greater than or equal to 1.5 inches, greater than or equal to 2.0 inches, greater than or equal to 2.5 inches, greater than or equal to 3.0 inches, greater than or equal to 3.5 inches, greater than or equal to 4.0 inches, or greater than or equal to 4.5 inches on average from each of the filaments in the filament array. In some embodiments, the mold is positioned at a distance of less than or equal to 5.0 inches, less than or equal to 4.5 inches, less than or equal to 4.0 inches, less than or equal to 3.5 inches, less than or equal to 3.0 inches, less than or equal to 2.5 inches, less than or equal to 2.0 inches, less than or equal to 1.5 inches, less than or equal to 1.0 inch, less than or equal to 0.5 inches, less than or equal to 0.4 inches, less than or equal to 0.3 inches, or less than or equal to 0.2 inches on average from each of the filaments in the filament array. Combinations of the above-referenced ranges are also possible (e.g., greater than or equal to 0.1 inches and less than or equal to 5.0 inches, greater than or equal to 0.1 inches and less than or equal to 4.0 inches). Other ranges are also possible. In some embodiments, each filament in the filament array may be positioned at a distance from a mold that is substantially the same (e.g., the standard deviation of the distance between the mold and the plurality of filaments in the filament array is less than or equal to 10%, less than or equal to 5%, less than or equal to 2%, or less than or equal to 1% of the distance between the mold and the plurality of filaments). In some embodiments, different filaments in the filament array may be positioned at substantially different distances from the mold.

It should be understood that the ranges described above for the distance between the filament array and the mold may refer to distances between filament arrays with a variety of shapes and sizes and molds with a variety of shapes and sizes. Similarly, the ranges for the standard deviation of the distance between the mold and the plurality of filaments in the filament array may refer to standard deviations of distances between filament arrays with a variety of shapes and sizes and molds with a variety of shapes and sizes.

In some embodiments, the mold and the filament array may have cross-sections similar to those shown in FIG. 3A. In other words, certain molds and filaments may be separated by a distance that is relatively constant across each filament in the filament array. As shown in more detail in FIG. 3B as distances 490A, 490B, and 490C, in certain embodiments, distance 490 between filament 210 and mold 400 is relatively constant. Distance 490A between portion 210A of filament 210 and portion 400A of mold 400, distance 490B between portion 210B of filament 210 and portion 400B of mold 400, and distance 490C between portion 210C of filament 210 and portion 400C of mold 400 are approximately equal. In systems comprising molds and filaments with geometries similar to those shown in FIG. 3B, the maximum distance between the filament array and the mold, the minimum distance between the filament array and the mold, and the average distance between the filament array and the mold are also equivalent.

Figure 3B:
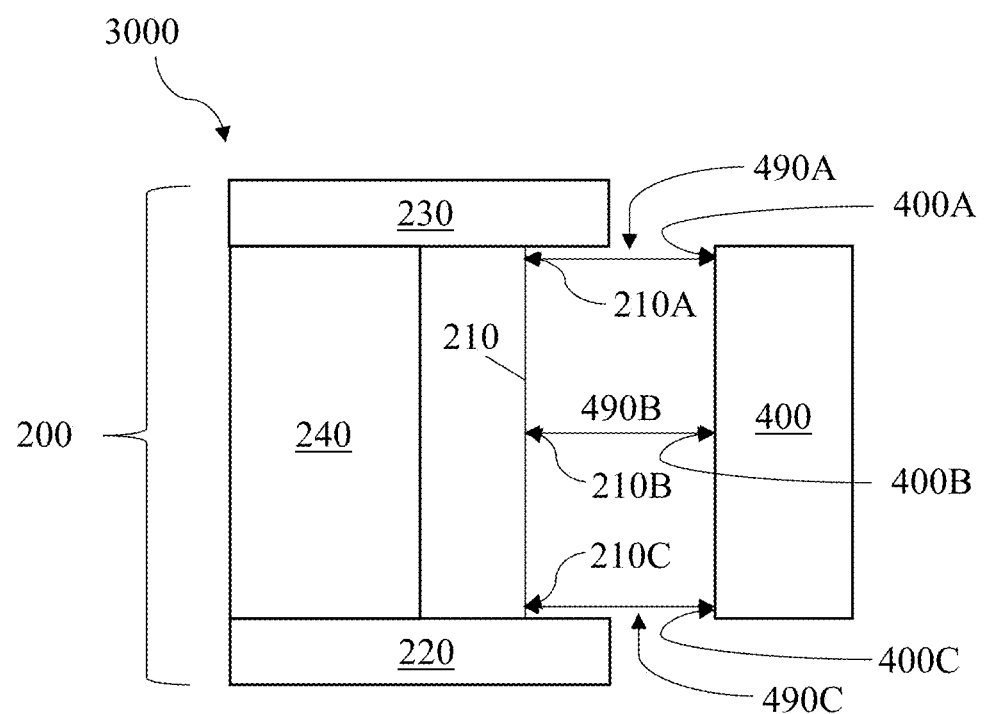
FIG. 3B shows a schematic depiction of a non-limiting embodiment of a system comprising a mold and a filament assembly.
Figure 3C:
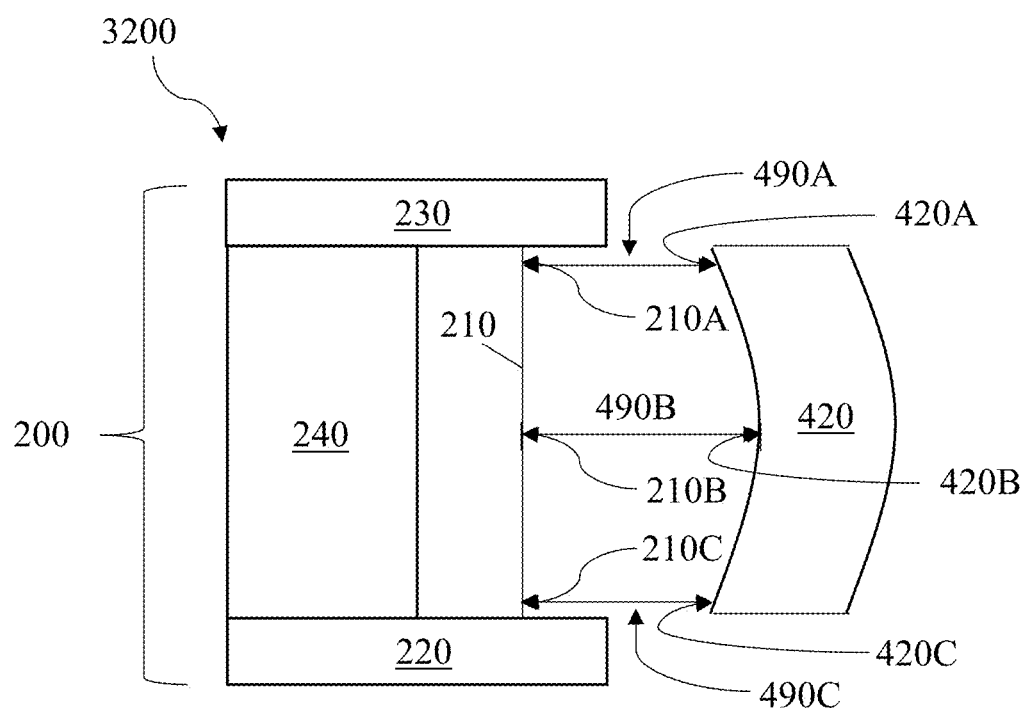
FIG. 3C shows a schematic depiction of a non-limiting embodiment of a system comprising a mold and a filament assembly.

In some embodiments, a mold and/or a filament array have a shape and/or size other than that shown in FIG. 3A and FIG. 3B. For instance, a mold may comprise one or more portions that are concave and/or may comprise one or more portions that are convex. In FIG. 3C, system 3200 comprises filament assembly 200 and mold 420. System 3200 may comprise further features that are not shown in FIG. 3C, such as a gas inlet port. Filament assembly 200 comprises first frame portion 220, second frame portion 230, third frame portion 240, and filament 210. Mold 420 is concave, and so the distance between mold 420 and filament 210 varies across filament 210. By way of example, distance 490A between portion 210A of filament 210 and portion 420A of mold 420 is different from distance 490B between portion 210B of filament 210 and portion 420B of mold 420. Distance 490B is different from distance 490C between portion 210C of filament 210 and portion 420C of mold 420. For mold 420, distance 490A is equivalent distance 490C. However, for certain molds comprising concave portions and/or convex portions, distance 490A may be different from distance 490C.

For molds comprising concave and/or convex portions, the distance between the mold and the filament assembly referred to above should be understood to refer to one or more of the following distances: an average maximum distance between the filament array and the mold, an average minimum distance between the filament array and the mold, an average distance between the filament array and the mold, an average distance between any specific portion of the filament array and the mold (e.g., an average distance of a portion of the filament array equidistant from the first and second frame portions and the mold), or any distance between any portion of the filament array and the mold. The average maximum distance between the filament array and the mold may be determined by determining the maximum distance between the filament array and the mold for each filament (e.g., distance 490B in FIG. 3C) and then averaging this distance over all of the filaments in the filament array. The average minimum distance between the filament array and the mold may be determined by determining the minimum distance between the filament array and the mold for each filament (e.g., distance 490A or distance 490C in FIG. 3C) and then averaging this distance over all of the filaments in the filament array. The average distance between the filament array and the mold may be determined by averaging the distance between the filament array and the mold over each filament (e.g., averaging distances 490A, 490B, 490C, and every other distance between the filament array and the mold over the length of filament 210) and then averaging this distance over all of the filaments in the filament array.

In some embodiments, a system may comprise a filament assembly comprising a plurality of filaments forming a filament array, and the filaments in the filament array may be positioned at an advantageous distance from each nearest neighbor. In some embodiments, an average distance between each filament in the filament array and its nearest neighbor may be greater than or equal to 0.1 inches, greater than or equal to 0.25 inches, greater than or equal to 0.5 inches, greater than or equal to 0.75 inches, greater than or equal to 1 inch, greater than or equal to 1.25 inches, greater than or equal to 1.5 inches, greater than or equal to 1.75 inches, greater than or equal to 2 inches, or greater than or equal to 2.25 inches. In some embodiments, an average distance between each filament in the filament array and its nearest neighbor may be less than or equal to 2.5 inches, less than or equal to 2.25 inches, less than or equal to 2 inches, less than or equal to 1.75 inches, less than or equal to 1.5 inches, less than or equal to 1.25 inches, less than or equal to 1 inch, less than or equal to 0.75 inches, less than or equal to 0.5 inches, or less than or equal to 0.25 inches. Combinations of the above-referenced ranges are also possible (e.g., greater than or equal to 0.1 inches and less than or equal to 2.5 inches). Other ranges are also possible.

In some embodiments, each filament in a filament array may be positioned at a distance from its nearest neighbor that is substantially the same (e.g., the standard deviation of the distance between each filament and its nearest neighbor is less than or equal to 10%, less than or equal to 5%, less than or equal to 2%, or less than or equal to 1% of the distance between the each filament and its nearest neighbor). In some embodiments, different filaments in the filament array may be positioned at substantially different distances from its nearest neighbor.

In some embodiments, a system may comprise a filament assembly comprising a plurality of filaments forming a filament array, and the filaments in the filament array may be positioned at the outer edge of the filament assembly and/or along the circumference of the filament assembly. In some embodiments, the filament assembly may be substantially cylindrical, and the filament array may form the non-circular side of the filament assembly.

In some embodiments, the filament array may be designed and positioned to provide uniform elevated temperature conditions in the vicinity of the mold surfaces to be coated. The filaments may be a wires which are heated by resistive heating. For example, the filaments may be connected to a DC voltage source and electrical ground. Suitable filament materials include highly resistive metals such as tantalum, tungsten, rhenium, copper alloys, and nickel-chromium, amongst others. The filaments may have any suitable geometry. In some cases, it is preferable that the filament geometry is serpentine over a relatively large area to provide uniform heating in the vicinity of the mold surfaces. However, other filament geometries (e.g., coils) are also possible.

In some embodiments, one or more dimensions of a filament assembly may be adjusted by an operator. For example, the filament assembly may comprise first and second frame portions that may be translated with respect to each other. The first and second frame portion may be connected by one or more spring assemblies that allow the distance between them to be adjusted. The spring assembly may include a spring disposed around a rod. The first and/or second portions can slide along the rod to increase or decrease the distance between the first and second frame portions over which the filament segments extend to compensate for the expansion/contraction of the filament segments during heating and cooling. Thus, in some embodiments, the spring assembly enables self-adjustment of this distance. Other methods for adjusting the distance between the first and second frame portions are also possible.

In some embodiments, one or more filaments within a filament array may be connected to the filament assembly by pins. The pins may be arranged within the first and second frame portions to move back and forth, which allows for additional control over the distance between the filament array and the mold surface.

In some embodiments, a filament assembly may comprise a first frame portion and a second frame portion that are separated by a distance of greater than or equal to 12 inches, greater than or equal to 15 inches, greater than or equal to 17.5 inches, greater than or equal to 20 inches, greater than or equal to 22.5 inches, greater than or equal to 25 inches, or greater than or equal to 27.5 inches. In some embodiments, the first frame portion and second frame portion are separated by a distance of less than or equal to 30 inches, less than or equal to 27.5 inches, less than or equal to 25 inches, less than or equal to 22.5 inches, less than or equal to 20 inches, less than or equal to 17.5 inches, or less than or equal to 15 inches. Combinations of the above-referenced ranges are also possible (e.g., greater than or equal to 12 inches and less than or equal to 20 inches, or greater than or equal to 12 inches and less than or equal to 30 inches). Other ranges are also possible.

In some embodiments, a filament assembly may comprise a first frame portion with a diameter of greater than or equal to 8 inches, greater than or equal to 10 inches, greater than or equal to 15 inches, greater than or equal to 20 inches, greater than or equal to 25 inches, greater than or equal to 30 inches, or greater than or equal to 35 inches. In some embodiments, a filament assembly may comprise a first frame portion with a diameter of less than or equal to 40 inches, less than or equal to 35 inches, less than or equal to 30 inches, less than or equal to 25 inches, less than or equal to 20 inches, less than or equal to 15 inches, or less than or equal to 10 inches. Combinations of the above-referenced ranges are also possible (e.g., greater than or equal to 8 inches and less than or equal to 40 inches). Other ranges are also possible. As used herein, the diameter of the first frame portion is given its ordinary meaning for substantially cylindrical first frame portions. The diameter of a first frame portion with a non-cylindrical shape is the diameter of a cylindrical first frame portion with the same height and volume as the first frame portion with the non-cylindrical shape.

In some embodiments, a filament assembly may comprise a second frame portion with a diameter of greater than or equal to 8 inches, greater than or equal to 10 inches, greater than or equal to 15 inches, greater than or equal to 20 inches, greater than or equal to 25 inches, greater than or equal to 30 inches, or greater than or equal to 35 inches. In some embodiments, a filament assembly may comprise a second frame portion with a diameter of less than or equal to 40 inches, less than or equal to 35 inches, less than or equal to 30 inches, less than or equal to 25 inches, less than or equal to 20 inches, less than or equal to 15 inches, or less than or equal to 10 inches. Combinations of the above-referenced ranges are also possible (e.g., greater than or equal to 8 inches and less than or equal to 40 inches). Other ranges are also possible. As used herein, the diameter of the second frame portion is given its ordinary meaning for substantially cylindrical second frame portions. The diameter of a second frame portion with a non-cylindrical shape is the diameter of a cylindrical second frame portion with the same height and volume as the second frame portion with the non-cylindrical shape.

Figure 6:
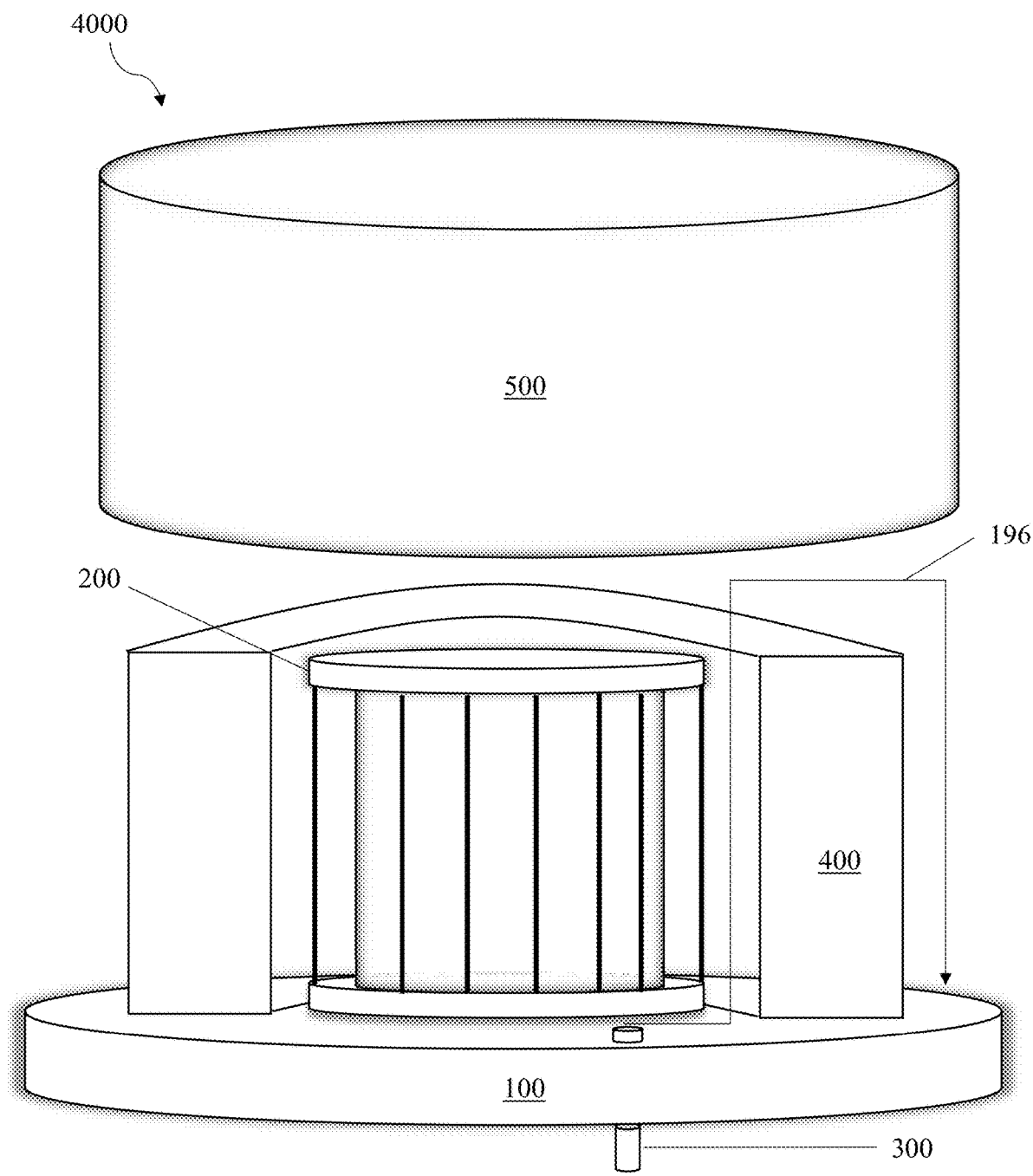
FIG. 6 shows a schematic depiction of a non-limiting embodiment of a system comprising a filament array, a mold support, a mold, a gas inlet port and a deposition chamber.

In certain embodiments, as described above, a filament assembly as described herein may be positioned within a system for depositing a coating onto a surface of a mold. FIG. 6 shows a cross-section of one non-limiting example of a system 4000 adapted and arranged for this purpose, which includes mold support 100, filament assembly 200, gas inlet port 300, mold 400 disposed on the mold support, and deposition chamber 500. Deposition chamber 500 may be lowered such that it encloses the filament assembly and the mold. The deposition chamber may form a vacuum-tight seal or gas-tight seal with the mold support, and may allow for reduced pressures to be maintained during coating deposition. In some embodiments, a gaseous species may flow through the deposition chamber as indicated by arrow 196. For example, the gaseous species may be introduced into the system by the gas inlet port, flow by the filament array, and flow out of the deposition chamber. In some embodiments, at least a portion of the gas flow may be substantially parallel to the filament assembly and/or substantially parallel to a central axis of the filament assembly.

It should be understood that the geometries shown in FIG. 6 are exemplary, and that certain embodiments comprise one or more components with different geometries than that shown in FIG. 6. As an example, a system may comprise a mold support that is not a cylindrical disk, that includes one or more portions positioned concentrically around the mold, that includes a central aperture, has more than one component, or has any other suitable morphology. In some embodiments, a system may comprise a mold that lacks a portion positioned beneath the filament assembly, and/or that includes one or more portions positioned concentrically around the filament assembly. In some embodiments, a mold support comprises at least one portion positioned beneath the filament assembly and at least one portion positioned concentrically around the filament assembly. In other words, certain mold assemblies comprise a portion positioned with respect to the filament assembly shown in FIG. 1 and a portion positioned with respect to the filament assembly shown in FIG. 6.

In some embodiments, one or more portions of the system may be positioned with respect to one or more other components in an advantageous manner. For example, in some embodiments a mold may be positioned concentrically around a filament assembly. As second example, the deposition chamber may be positioned around a central axis of the system and/or positioned around the mold. As a third example, the filament assembly may be positioned concentrically around a center of the deposition chamber and/or positioned concentrically around a central axis of the system. Without wishing to be bound by theory, it is believed that one or more of these features may promote relatively even gas flow throughout the chamber and past the filaments, which may promote the formation of uniform coatings and/or may result in a smaller amount of wasted gaseous species than other configurations.

Figure 7:
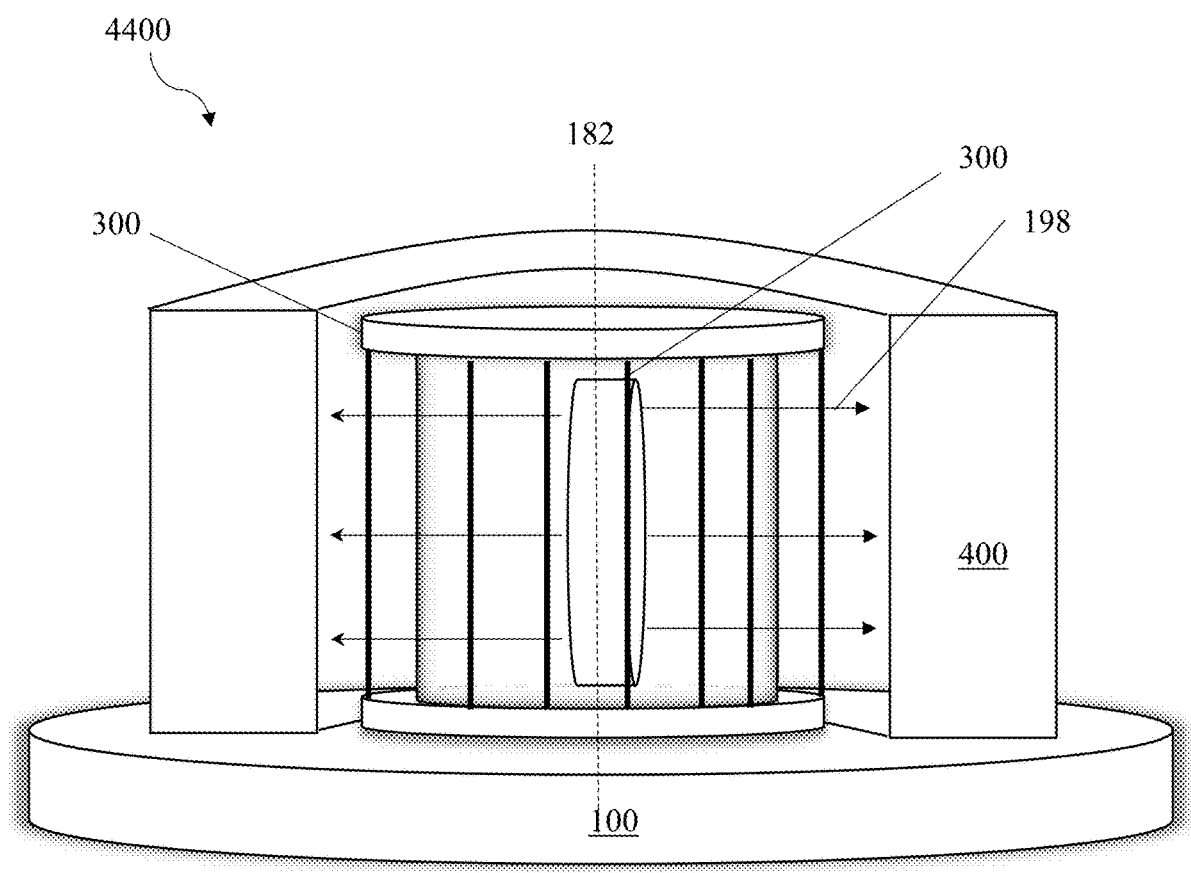
FIG. 7 shows a schematic depiction of a non-limiting embodiment of a system comprising a filament array, a mold support, a mold, a gas inlet port and a deposition chamber.

For instance, a mold positioned concentrically around a filament array that is positioned concentrically around a third frame portion of a filament assembly may provide a gas flow pathway with a donut-shaped cross-section, which may be advantageous for promoting gas flow parallel to a filament assembly and/or a central axis thereof. This design may promote a more beneficial flow of gas than other designs in which gas flows outwardly through the filament assembly, e.g., from a source positioned at the center of a non-planar filament array or along a central axis of the non-planar filament array. FIG. 7 shows one example of a perspective view of a less desirable system 4400, where gas inlet port 300 is adapted and arranged to cause gas to flow outwards from central axis 182 (or perpendicular to the central axis) as shown by arrows 198. This design is less desirable because it does not result in the formation of coatings that are as uniform as those produced by other systems described herein, and wastes a larger amount of gas than other systems described herein.

Figure 8A:
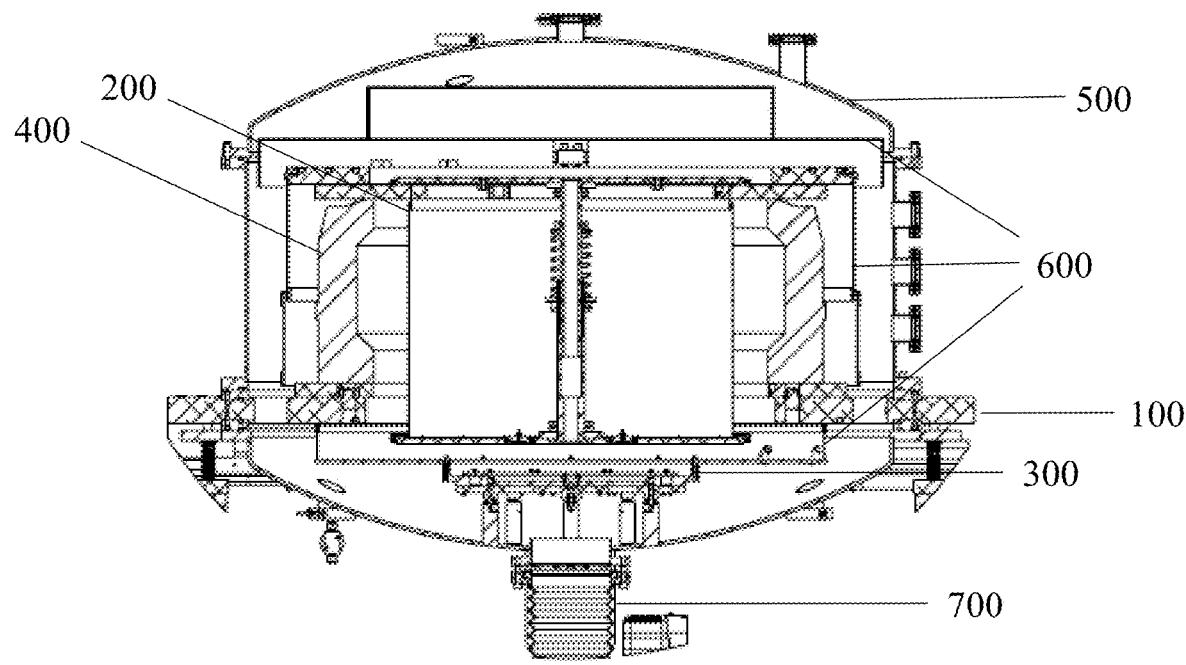
FIG. 8A and FIG. 8B show schematic depictions of non-limiting embodiments of systems for depositing coatings on the surfaces of molds.
Figure 8B:
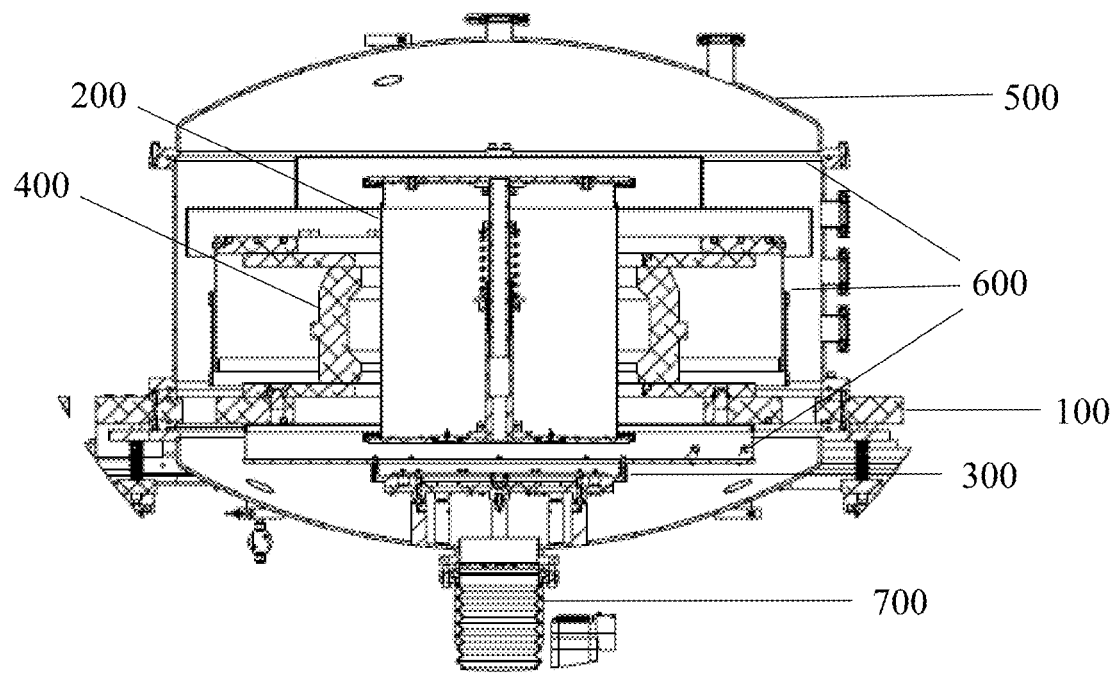

In some embodiments, a system as described herein may have a design similar to that shown in FIG. 8A or in FIG. 8B. Each Figure shows a system comprising mold support 100, filament assembly 200, gas inlet port 300, mold 400 disposed on the mold support, and deposition chamber 500. FIGS. 8A and 8B also show baffles 600 and outlet 700. The baffles may help direct the flow of gas around the chamber. The outlet provides a pathway through which the gaseous species can exit the deposition chamber.

Further properties of different system components will be described in further detail below.

As described above, certain embodiments relate to a system for coating a mold and/or to a system that comprises a mold, such as a tire mold. In some embodiments, the mold may be non-planar. For example, the mold may be a cylindrical mold, a cuboid mold, or a mold of any other shape. In some embodiments, the system may be adapted and arranged to coat an interior surface of a non-planar mold, such as an interior surface of a substantially cylindrical mold (e.g., the interior surface of a tire mold). The mold and any portions thereof to be coated may have any suitable geometry and functionality. In some embodiments, the portion of the mold to be coated may be a surface of the mold which forms the tread of the tire during the molding process. In some embodiments, the portion of the mold coated may be the surface which forms the sidewall of the tire during the molding process. Filament design and spacing, flow baffling, and gas inlet and outlet design may be selected to provide optimal flow and coating deposition depending on mold features such as those listed above. It should be understood that in some embodiments the mold may lack tire treads and/or tire sidewalls, and that other portions of the mold may be coated in addition to or instead of the portions described above.

Figure 9:
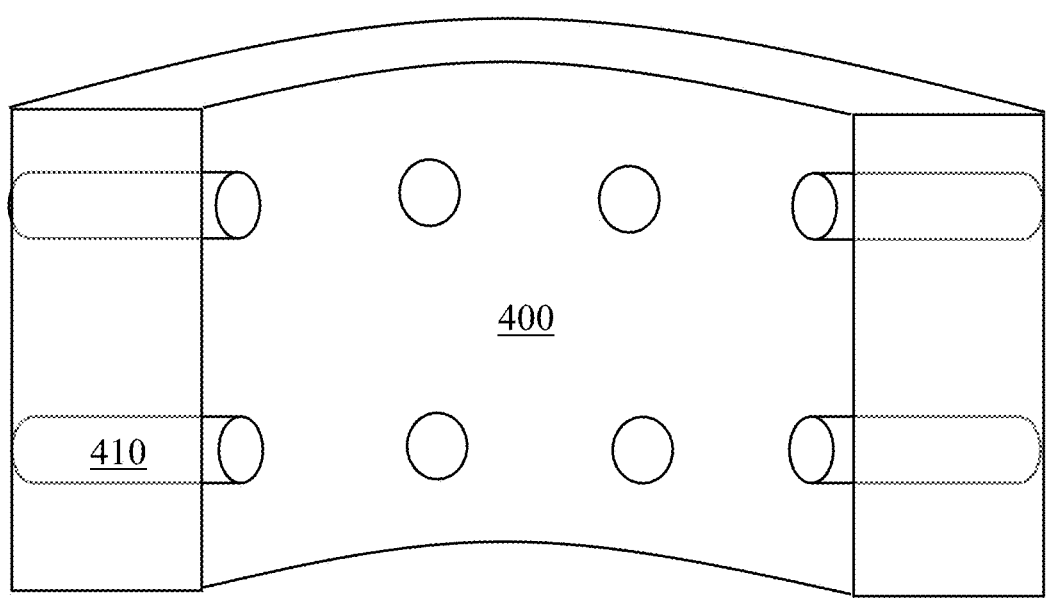
FIG. 9 shows a schematic depiction of a non-limiting embodiment of a cylindrical mold comprising vent ports.

In some embodiments, the mold may have one or more advantageous features. For example, the mold may comprise one or more vent ports. FIG. 9 shows one non-limiting example of a cross-section of cylindrical mold 400 comprising vent ports 410. The vent ports may be holes which are open to the ambient to release vapor during use of the mold. For example, during vulcanization for tire molds. The vent ports may have any suitable diameter. In some embodiments, the vent ports have a diameter of greater than or equal to 10 microns, greater than or equal to 20 microns, greater than or equal to 50 microns, greater than or equal to 100 microns, greater than or equal to 200 microns, greater than or equal to 500 microns, greater than or equal to 1 mm, greater than or equal to 2 mm, or greater than or equal to 5 mm. In some embodiments, the vent ports have a diameter of less than or equal to 1 cm, less than or equal to 5 mm, less than or equal to 2 mm, less than or equal to 1 mm, less than or equal to 500 microns, less than or equal to 200 microns, less than or equal to 100 microns, less than or equal to 50 microns, or less than or equal to 20 microns. Combinations of the above-referenced ranges are also possible (e.g., greater than or equal to 10 microns and less than or equal to 1 cm, or greater than or equal to 10 microns and less than or equal to 5 mm). Other ranges are also possible.

In some embodiments, the system may be adapted and arranged to coat a mold without clogging any vent ports therein. In other words, the vent ports may not be substantially occluded during deposition of a coating, such as a conformal coating. For example, the system may be adapted and arranged to coat the mold such that the vent holes have greater than or equal to 50%, greater than or equal to 75%, greater than or equal to 90%, greater than or equal to 95%, greater than or equal to 97.5%, or greater than or equal to 99% of their initial volume at the conclusion of the coating process.

The mold may have any suitable dimensions that provide the desired product. For example, the mold may be sized to produce a product (e.g., a tire) having a width of greater than or equal to 100 mm, greater than or equal to 150 mm, greater than or equal to 200 mm, greater than or equal to 250 mm, greater than or equal to 300 mm, greater than or equal to 350 mm, greater than or equal to 400 mm, greater than or equal to 450 mm, greater than or equal to 500 mm, greater than or equal to 550 mm, greater than or equal to 600 mm, or greater than or equal to 650 mm. The mold may be sized to produce a product having a width of less than or equal to 700 mm, less than or equal to 650 mm, less than or equal to 600 mm, less than or equal to 550 mm, less than or equal to 500 mm, less than or equal to 450 mm, less than or equal to 400 mm, less than or equal to 350 mm, less than or equal to 300 mm, less than or equal to 250 mm, less than or equal to 200 mm, or less than or equal to 150 mm. Combinations of the above-referenced ranges are also possible (e.g., greater than or equal to 150 mm and less than or equal to 500 mm, or greater than or equal to 100 mm and less than or equal to 700 mm). Other ranges are also possible.

In some embodiments, the mold may have a largest cross-sectional dimension of greater than or equal to 350 mm, greater than or equal to 400 mm, greater than or equal to 450 mm, greater than or equal to 500 mm, greater than or equal to 550 mm, greater than or equal to 600 mm, greater than or equal to 650 mm, greater than or equal to 700 mm, greater than or equal to 750 mm, greater than or equal to 800 mm, greater than or equal to 850 mm, greater than or equal to 900 mm, greater than or equal to 950 mm, greater than or equal to 1000 mm, greater than or equal to 1050 mm, greater than or equal to 1100 mm, greater than or equal to 1150 mm, greater than or equal to 1200 mm, greater than or equal to 1250 mm, greater than or equal to 1300 mm, greater than or equal to 1350 mm, greater than or equal to 1400 mm, greater than or equal to 1450 mm, greater than or equal to 1500 mm, greater than or equal to 1550 mm, greater than or equal to 1600 mm, greater than or equal to 1650 mm, greater than or equal to 1700 mm, greater than or equal to 1750 mm, greater than or equal to 1800 mm, greater than or equal to 1850 mm, greater than or equal to 1900 mm, or greater than or equal to 1950 mm. The mold may have a largest cross-sectional dimension of less than or equal to 2000 mm, less than or equal to 1950 mm, less than or equal to 1900 mm, less than or equal to 1850 mm, less than or equal to 1800 mm, less than or equal to 1750 mm, less than or equal to 1700 mm, less than or equal to 1650 mm, less than or equal to 1600 mm, less than or equal to 1550 mm, less than or equal to 1500 mm, less than or equal to 1450 mm, less than or equal to 1400 mm, less than or equal to 1350 mm, less than or equal to 1300 mm, less than or equal to 1250 mm, less than or equal to 1200 mm, less than or equal to 1150 mm, less than or equal to 1100 mm, less than or equal to 1050 mm, less than or equal to 1000 mm, less than or equal to 950 mm, less than or equal to 900 mm, less than or equal to 850 mm, less than or equal to 800 mm, less than or equal to 750 mm, less than or equal to 700 mm, less than or equal to 650 mm, less than or equal to 600 mm, less than or equal to 550 mm, less than or equal to 500 mm, less than or equal to 450 mm, or less than or equal to 400 mm. Combinations of the above-referenced ranges are also possible (e.g., greater than or equal to 350 mm and less than or equal to 2000 mm).

Other ranges are also possible. In some embodiments, the cross-sectional dimension is the diameter of the mold (e.g., in the case of a substantially cylindrical mold).

In some embodiments, a mold may have a diameter of greater than or equal to 350 mm, greater than or equal to 400 mm, greater than or equal to 450 mm, greater than or equal to 500 mm, greater than or equal to 550 mm, greater than or equal to 600 mm, greater than or equal to 650 mm, greater than or equal to 700 mm, greater than or equal to 750 mm, greater than or equal to 800 mm, greater than or equal to 850 mm, greater than or equal to 900 mm, greater than or equal to 950 mm, greater than or equal to 1000 mm, greater than or equal to 1050 mm, greater than or equal to 1100 mm, greater than or equal to 1150 mm, greater than or equal to 1200 mm, greater than or equal to 1250 mm, greater than or equal to 1300 mm, greater than or equal to 1350 mm, greater than or equal to 1400 mm, greater than or equal to 1450 mm, greater than or equal to 1500 mm, greater than or equal to 1550 mm, greater than or equal to 1600 mm, greater than or equal to 1650 mm, greater than or equal to 1700 mm, greater than or equal to 1750 mm, greater than or equal to 1800 mm, greater than or equal to 1850 mm, greater than or equal to 1900 mm, or greater than or equal to 1950 mm. The mold may have a diameter of less than or equal to 2000 mm, less than or equal to 1950 mm, less than or equal to 1900 mm, less than or equal to 1850 mm, less than or equal to 1800 mm, less than or equal to 1750 mm, less than or equal to 1700 mm, less than or equal to 1650 mm, less than or equal to 1600 mm, less than or equal to 1550 mm, less than or equal to 1500 mm, less than or equal to 1450 mm, less than or equal to 1400 mm, less than or equal to 1350 mm, less than or equal to 1300 mm, less than or equal to 1250 mm, less than or equal to 1200 mm, less than or equal to 1150 mm, less than or equal to 1100 mm, less than or equal to 1050 mm, less than or equal to 1000 mm, less than or equal to 950 mm, less than or equal to 900 mm, less than or equal to 850 mm, less than or equal to 800 mm, less than or equal to 750 mm, less than or equal to 700 mm, less than or equal to 650 mm, less than or equal to 600 mm, less than or equal to 550 mm, less than or equal to 500 mm, less than or equal to 450 mm, or less than or equal to 400 mm. Combinations of the above-referenced ranges are also possible (e.g., greater than or equal to 350 mm and less than or equal to 2000 mm). Other ranges are also possible. As used herein, the diameter of a mold is given its ordinary meaning for substantially cylindrical molds. The diameter of a mold with a non-cylindrical shape is the diameter of a cylindrical mold with the same height and volume as the mold with the non-cylindrical shape.

In some embodiments, a mold may have a height of greater than or equal to 100 mm, greater than or equal to 200 mm, greater than or equal to 300 mm, greater than or equal to 400 mm, greater than or equal to 500 mm, greater than or equal to 600 mm, greater than or equal to 700 mm, greater than or equal to 800 mm, or greater than or equal to 900 mm. The mold may have a height of less than or equal to 1000 mm, less than or equal to 900 mm, less than or equal to 800 mm, less than or equal to 700 mm, less than or equal to 600 mm, less than or equal to 500 mm, less than or equal to 400 mm, less than or equal to 300 mm, or less than or equal to 200 mm. Combinations of the above-referenced ranges are also possible (e.g., greater than or equal to 100 mm and less than or equal to 1000 mm). Other ranges are also possible.

The mold may be formed of any suitable material used in the art including metals such as aluminum and iron, and steel alloys such as stainless steel.

As described above, in certain embodiments a system may comprise a mold support. The mold support may be adapted and arranged to support the mold inside the deposition chamber. In general, any suitable supporting device may be used including clamping devices. In some cases, it may be preferable for the supporting device to be adjustable to accommodate molds having different sizes (e.g., tire molds having different sizes). That is, the supporting device may be designed to support molds having a range of sizes.

In some cases, the mold support is capable of clamping the mold piece. The mold support may be formed of extruded metal (e.g., aluminum) pieces. The pieces may have at least one cooling channel formed therein. The cooling channel(s), for example, extend(s) the length of the extruded piece and may be formed during the extrusion process. The pieces may also include a groove to facilitate attachment. The pieces may have any suitable length including greater than 4 inches, greater than 15 inches, greater than 25 inches, or greater than 40 inches. The pieces may be curved to conform to the shape of the mold using standard techniques (e.g., rolling). The supporting device may include multiple pieces arranged to extend around different portions of the mold in order to uniformly cool the mold and to provide sufficient support. The pieces may be supported at their back surfaces by a clamp or by attachment to other components of the apparatus (e.g., vacuum chamber). The mold support may have one or more advantageous features, such as having a simple structure and utilizing inexpensive and readily available extruded metal pieces (e.g., aluminum). Those of ordinary skill in the art know the meaning of, and can identify, extruded metal pieces.

In some embodiments, a mold support may be adapted and arranged to position a mold within the system at a desired location. For example, the mold support may be adapted and arranged to position the mold around a central axis of the system, or around the filament assembly.

It may also be preferable for a mold support to be capable of heating and/or cooling the mold surface. When cooling is desired, the supporting device may be formed of a thermally conductive material (e.g., metals such as aluminum) which can be cooled using conventional techniques. For example, the supporting device may include channels through which cooling fluid flows. It may be advantageous to cool the mold during coating formation in order to promote deposition of the gaseous species onto the mold. It may be advantageous to pre-heat the mold prior to coating. The mold may be heated by one or more of infrared heating, resistive current heating, and heating by flowing a heat transfer fluid (e.g., an oil) proximate to the mold and/or mold support. In some embodiments, the mold support may be capable of heating or cooling the mold to a temperature of greater than or equal to 0° C., greater than or equal to 25° C., greater than or equal to 50° C., greater than or equal to 75° C., greater than or equal to 100° C., greater than or equal to 125° C., greater than or equal to 150° C., greater than or equal to 175° C., greater than or equal to 200° C., greater than or equal to 225° C., greater than or equal to 250° C., greater than or equal to 275° C., greater than or equal to 300° C., greater than or equal to 325° C., greater than or equal to 350° C., greater than or equal to 375° C., greater than or equal to 400° C., greater than or equal to 425° C., greater than or equal to 450° C., or greater than or equal to 475° C. In some embodiments, the mold support may be capable of heating or cooling the mold to a temperature of less than or equal to 500° C., less than or equal to 475° C., less than or equal to 450° C., less than or equal to 425° C., less than or equal to 400° C., less than or equal to 375° C., less than or equal to 350° C., less than or equal to 325° C., less than or equal to 300° C., less than or equal to 275° C., less than or equal to 250° C., less than or equal to 225° C., less than or equal to 200° C., less than or equal to 175° C., less than or equal to 150° C., less than or equal to 125° C., less than or equal to 100° C., less than or equal to 75° C., less than or equal to 50° C., or less than or equal to 25° C. Combinations of the above-referenced ranges are also possible (e.g., greater than or equal to 0° C. and less than or equal to 500° C.). Other ranges are also possible.

As described above, certain systems may comprise a deposition chamber. The deposition chamber may be adapted and arranged to contain the mold and the filament array. In some embodiments, the deposition chamber may be capable of being disposed on the mold support, and/or of forming a vacuum-tight seal with the mold support.

A deposition chamber as described herein may have any suitable diameter. In some embodiments, the diameter of the deposition chamber is greater than or equal to 30 inches, greater than or equal to 40 inches, greater than or equal to 50 inches, or greater than or equal to 60 inches, or greater than or equal to 70 inches. In some embodiments, the diameter of the deposition chamber is less than or equal to 80 inches, less than or equal to 70 inches, less than or equal to 60 inches, less than or equal to 50 inches, or less than or equal to 40 inches. Combinations of the above-referenced ranges are also possible (e.g., greater than or equal to 30 inches and less than or equal to 80 inches). Other ranges are also possible. As used herein, the diameter of a deposition chamber is given its ordinary meaning for substantially cylindrical deposition chamber. It should be appreciated that deposition chambers may have other shapes that are not substantially cylindrical. In such cases, the diameter of the deposition chamber is the diameter of a deposition chamber with the same height and volume as the deposition chamber with the non-cylindrical shape.

In some embodiments, a system may comprise a deposition chamber may be adapted and arranged to be held under vacuum, or at a pressure below atmospheric pressure. The deposition chamber may be held at a pressure of less than or equal to 500 Torr, less than or equal to 200 Torr, less than or equal to 100 Torr, less than or equal to 50 Torr, less than or equal to 20 Torr, less than or equal to 10 Torr, less than or equal to 5 Torr, less than or equal to 2 Torr, less than or equal to 1 Torr, less than or equal to 0.5 Torr, less than or equal to 0.2 Torr, less than or equal to 0.1 Torr, less than or equal to 0.05 Torr, less than or equal to 0.02 Torr, less than or equal to 0.01 Torr, less than or equal to 0.005 Torr, less than or equal to 0.002 Torr, or less than or equal to 0.001 Torr. The deposition chamber may be held at a pressure of greater than or equal to 0.0005 Torr, greater than or equal to 0.001 Torr, greater than or equal to 0.002 Torr, greater than or equal to 0.005 Torr, greater than or equal to 0.01 Torr, greater than or equal to 0.02 Torr, greater than or equal to 0.05 Torr, greater than or equal to 0.1 Torr, greater than or equal to 0.2 Torr, greater than or equal to 0.5 Torr, greater than or equal to 1 Torr, greater than or equal to 2 Torr, greater than or equal to 5 Torr, greater than or equal to 10 Torr, greater than or equal to 20 Torr, greater than or equal to 50 Torr, greater than or equal to 100 Torr, or greater than or equal to 200 Torr. Combinations of the above-referenced ranges are also possible (e.g., greater than or equal to 0.0005 Torr and less than or equal to 500 Torr). Other ranges are also possible.

In some embodiments, a system may comprise a deposition chamber that is adapted and arranged to be translated vertically. The deposition chamber may be capable of being positioned adjacent a mold support, and may be capable of being positioned above a mold support or above a position where a mold support could be located.

The deposition chamber may be formed of any suitable material used in the art including metals such as aluminum, and steel alloys such as stainless steel.

As described above, certain embodiments relate to systems comprising one or more gas inlet ports. References to gas inlet ports herein should be understood to refer to a gas inlet port that contains a single gas inlet or to refer to gas inlet ports that comprise at least two gas inlets. The gas inlet port may be adapted and arranged to introduce a gaseous species into the deposition chamber. While the gas inlet port may be positioned in any suitable portion of the system, in some embodiments it may be beneficial for the gas inlet port to be positioned in a lower portion of the system. For example, the gas inlet port may pass through a mold support, or may be positioned beneath an aperture in a mold support. Without wishing to be bound by theory, many gaseous species typically rise naturally due to buoyancy, and so gas inlet ports positioned in a location that is lower than the filament assembly and that cause the gaseous species to flow upwards may have certain advantages. These advantages may include, for example, a higher degree of laminar flow and/or a reduction in the level of particulates in coatings. As another example, gaseous species flowing downwards may react to form particles during flow that may then fall and be caught on the mold surface, which can result in an undesirable lack of uniformity in the coatings. The gas inlet port may be positioned at any location with respect to a central axis of the system. In some embodiments, the gas inlet port is positioned between a third frame portion of the filament assembly and the filament array.

In some embodiments, the gas inlet port may include at least two gas inlets to promote distribution of the gaseous species around the mold surfaces to be coated. In some embodiments, the gas inlets may form the same non-planar shape as the mold and/or filament array. The gas inlets may have the same shape as a cross-section of the mold and/or filament array (e.g., a cross-section perpendicular to a direction of flow of the gaseous species through the deposition chamber, a cross-section perpendicular to the plurality of filaments). In some embodiments, the gas inlets may form a structure with an annular shape. However, other shapes are also be possible. The gas inlets may be disposed in a gas inlet port that has a series of small holes in its outer surface through which gas passes. The number and position of the holes is preferably selected so that the flow rate of gas is relatively uniform over the entire area of the gas inlet port. The selection of the number and position of holes may depend on process parameters (e.g., temperature and pressure, amongst others), as known to those of ordinary skill in the art. In certain embodiments, the apparatus may include a flow rate controller to provide additional control over the gas flow rate.

A gas inlet port may introduce gas at any suitable flow rate. In some embodiments, the gas inlet port may introduce gas at a flow rate of between 0.1 sccm and 10,000 sccm.

As described above, certain embodiments relate to systems that may comprise a gas outlet port. References to gas outlet ports herein should be understood to refer to a gas outlet port that contains a single gas outlet or to refer to gas outlet ports that comprise at least two gas outlets. The gas outlet port allows the removal of gas that has passed through the deposition chamber. In some embodiments, the gas outlet port may be positioned advantageously with respect to one or more other system components. As an example, the gas outlet port may be positioned between the mold and the deposition chamber. As another example, the gas outlet port may be positioned symmetrically with respect to a filament assembly, symmetrically with respect to a filament array, and/or symmetrically with respect to a mold. In certain cases, one or more gaseous species may flow relatively uniformly through the gas outlet port and/or any gas outlets therein. In some embodiments, a gas outlet port may comprise at least two gas outlets, and the flow through each gas outlet may be substantially the same.

As described above, in certain embodiments a system may comprise one or more baffles to direct flow of a gaseous species through a deposition chamber. Baffles may be any suitable structures which affect the direction of gas flow, such as portions of walls, flaps, and the like. In some embodiments, the system may comprise baffles adapted and arranged to direct the flow of the gaseous species to an outlet such as a gas outlet port. These baffles may comprise portions of an upper surface of the deposition chamber and/or outer walls of the deposition chamber.

Some embodiments relate to a system capable of being used continuously or semi-continuously. Systems capable of being used continuously or semi-continuously may be capable of performing two or more functions simultaneously and/or may be capable of performing any individual function for a given period of time without significant interruption. For example, a system may be capable of allowing an operator to prepare a first mold to be coated, remove a first mold that has been coated previously, and/or remove a used filament assembly while also depositing a coating onto a second mold. Preparing a first mold to be coated may comprise assembling the mold, positioning a mold on a mold support, preparing a filament assembly (e.g., by stringing a filament wire between a first frame portion and a second frame portion), and/or positioning a filament assembly on a mold support. As another example, a system may be capable of coating molds over a period of time of at least 10 minutes, at least 20 minutes, at least 30 minutes, at least 60 minutes, at least 90 minutes, at least 120 minutes, at least 150 minutes, at least 180 minutes, at least 210 minutes, at least 240 minutes, or at least 270 minutes with an average or total down time of less than or equal to 5 minutes. The system may be capable of coatings molds over a period of time of less than or equal to 300 minutes, less than or equal to 270 minutes, less than or equal to 240 minutes, less than or equal to 210 minutes, less than or equal to 180 minutes, less than or equal to 150 minutes, less than or equal to 120 minutes, less than or equal to 90 minutes, less than or equal to 60 minutes, less than or equal to 30 minutes, or less than or equal to 20 minutes with an average or total down time of less than or equal to 5 minutes. Combinations of the above-referenced ranges are also possible (e.g., greater than or equal to 10 minutes and less than or equal to 300 minutes). Other ranges are also possible. Systems capable of continuous or semi-continuous use may result in large increases in efficiency, because tasks that would otherwise need to be performed serially can be performed simultaneously. For instance, such systems may be able to coat molds at a higher rate than otherwise equivalent systems not capable of continuous or semi-continuous use, and/or may have a total or average down time of less than or equal to one third of otherwise equivalent systems not capable of continuous or semi-continuous use.

Figure 10A:
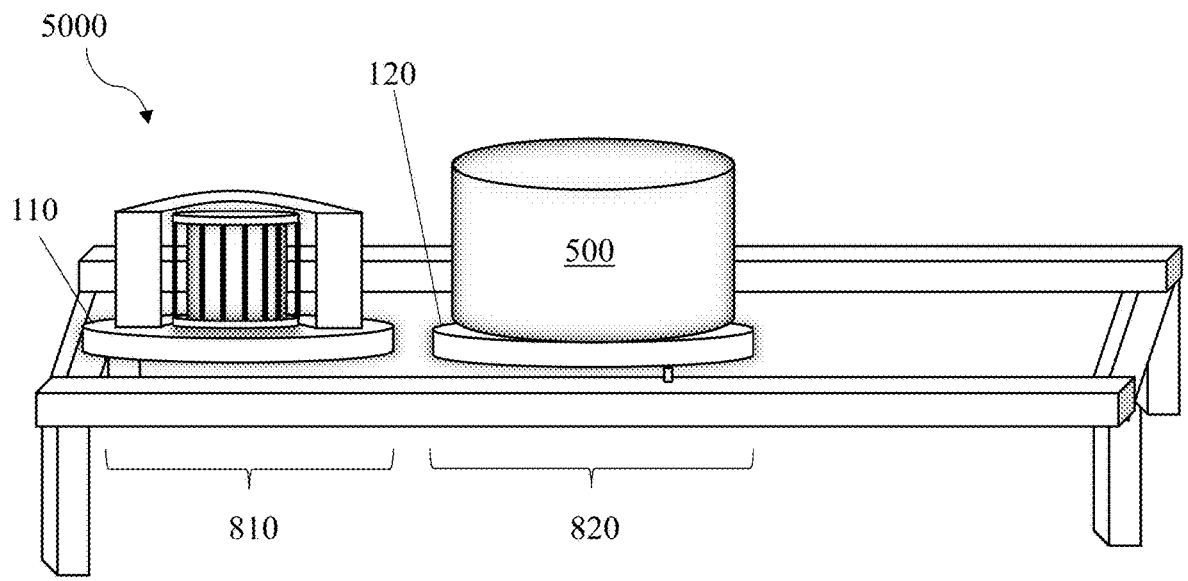
FIG. 10A-FIG. 10H show schematic depictions of non-limiting embodiments of systems comprising translatable mold supports.
Figure 10B:
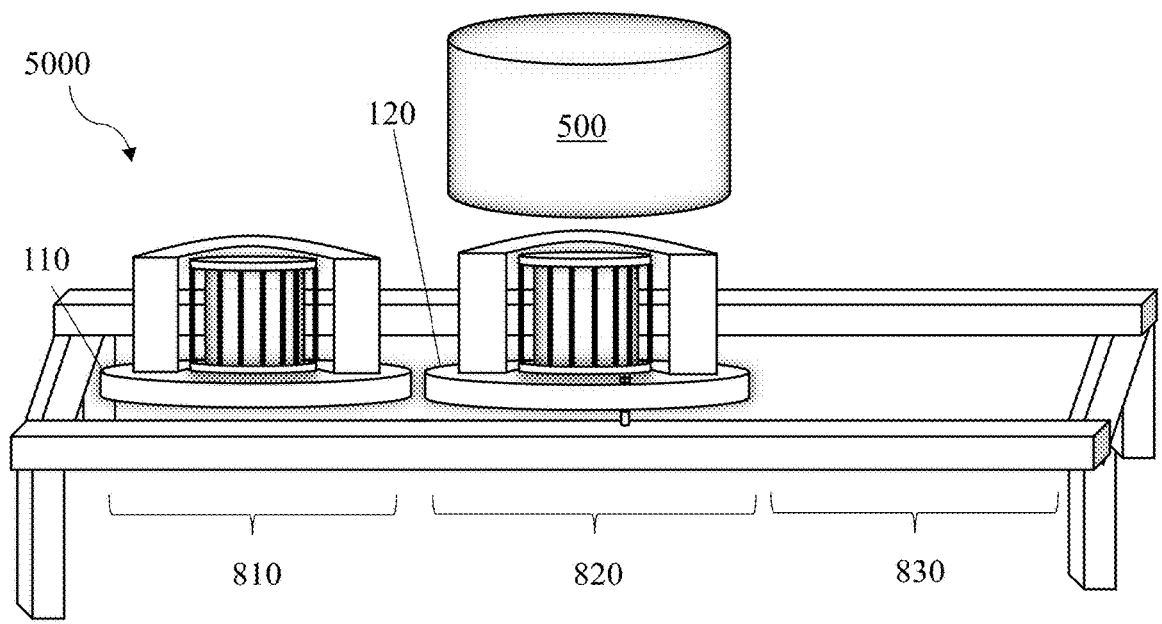
Figure 10C:
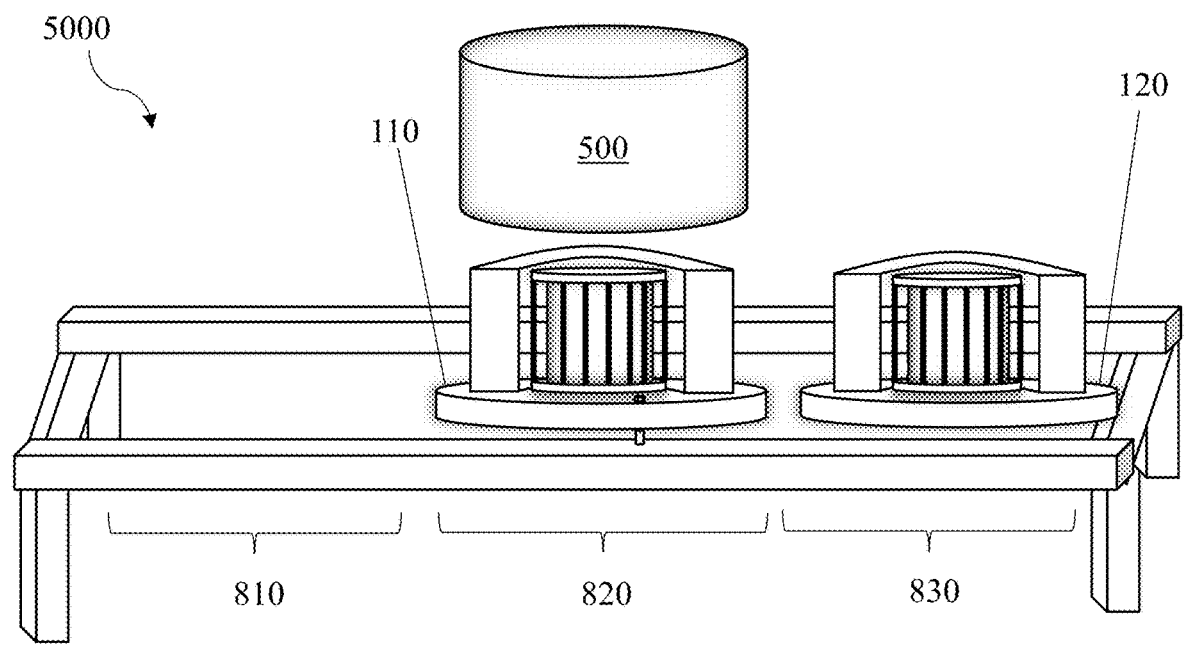
Figure 10D:
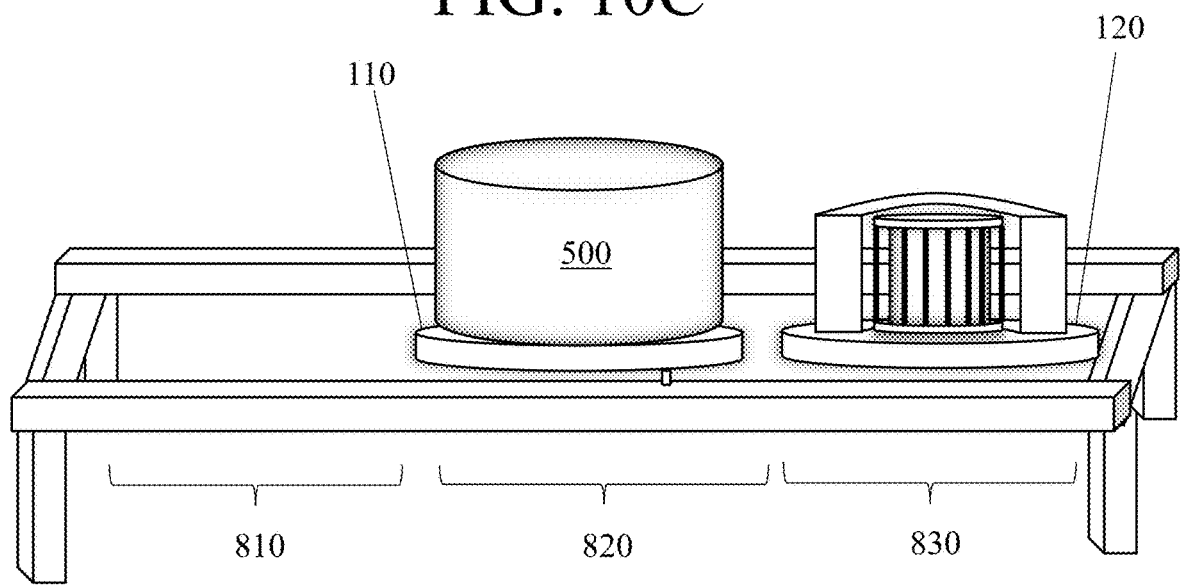
Figure 10E:
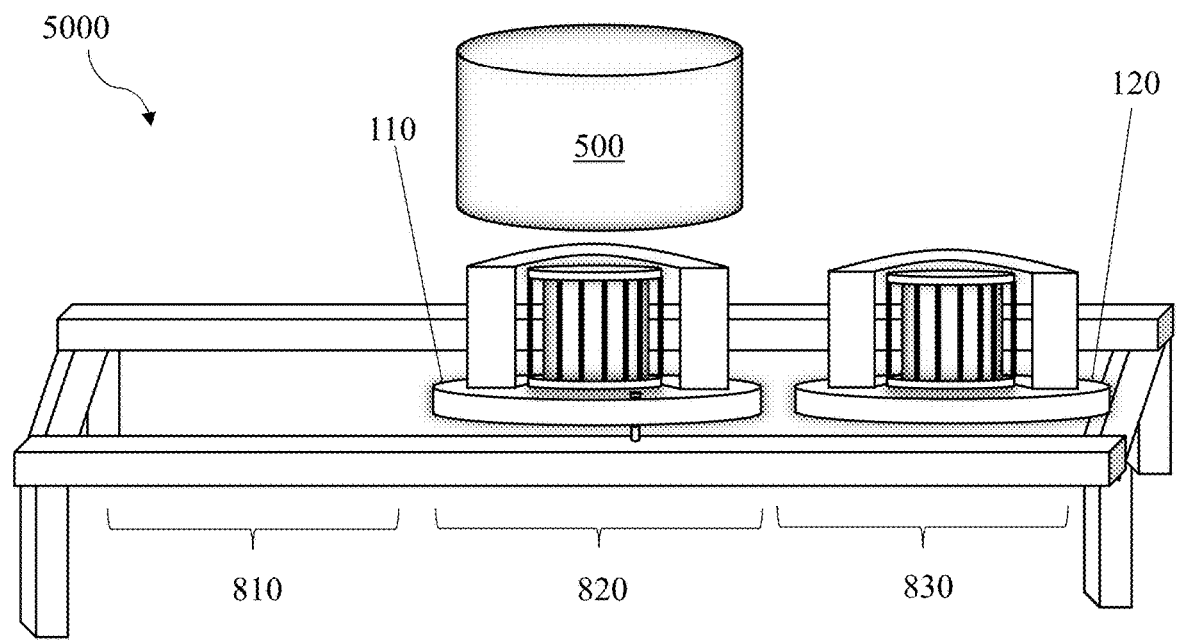
Figure 10F:
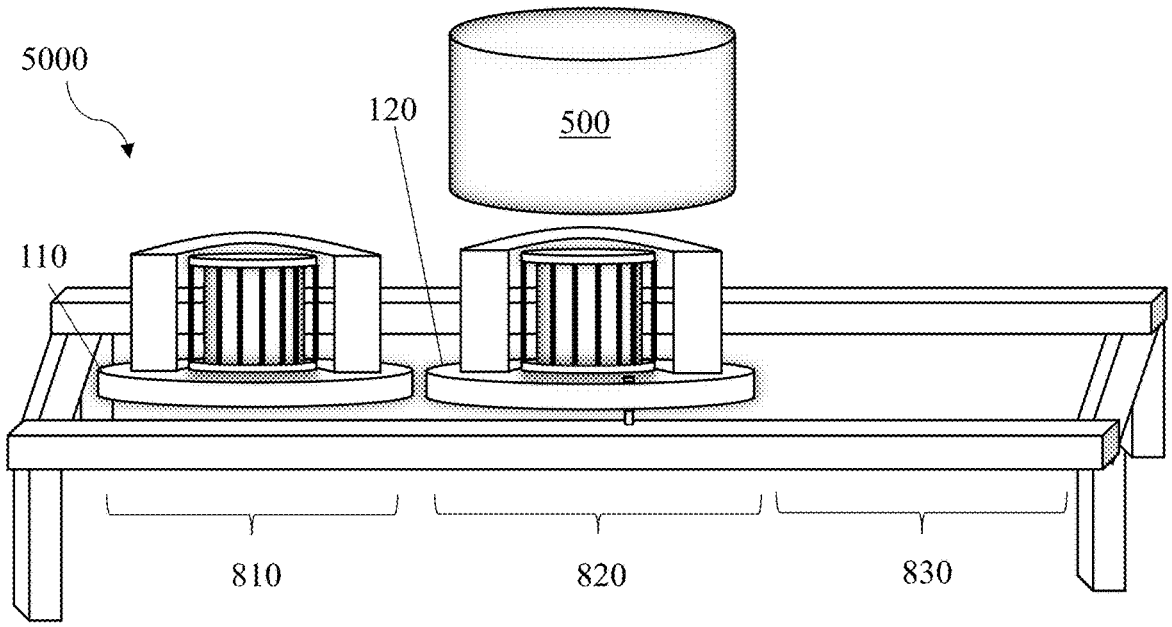
Figure 10G:
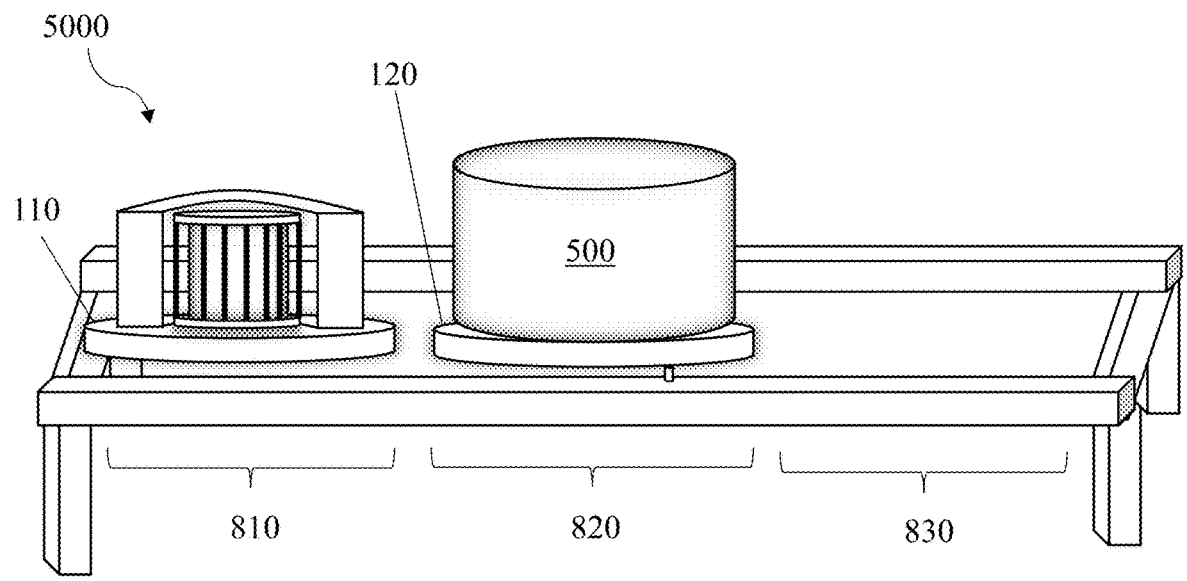
Figure 11:
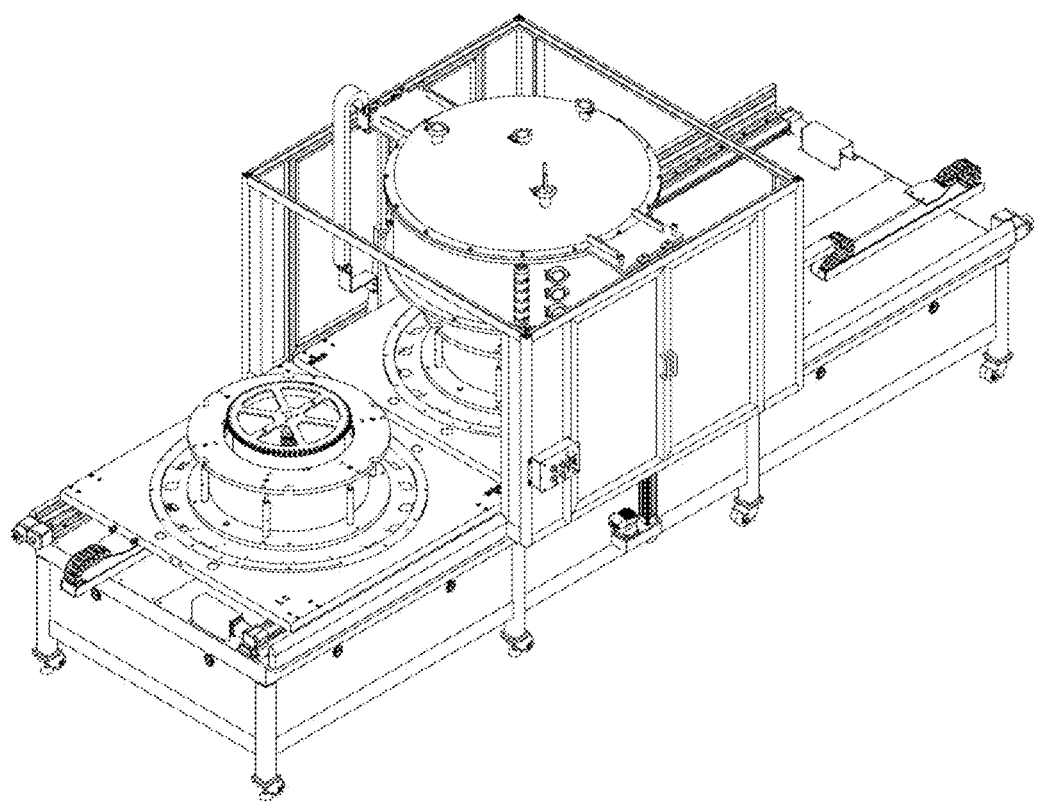
FIG. 11 shows a schematic depiction of a non-limiting embodiment of a system comprising translatable mold supports.

FIG. 10A-FIG. 10G show one non-limiting example of a system capable of being used continuously or semi-continuously. FIG. 11 shows a line drawing of an exemplary system capable of being used continuously. In FIG. 10A, system 5000 comprises first mold support 110 in first position 810, and deposition chamber 500 and second mold support 120 in second position 820. The deposition chamber is disposed on the second mold support, as would be the case during a coating process. Although FIG. 10A shows a filament assembly and a mold disposed on the mold support, it should be understood that this is not required. It should also be understood that neither a mold nor a filament assembly, one of a mold and a filament assembly, or both a mold and a filament assembly may be disposed on the first mold support when it is in the first position and/or when it is in the second position. Similarly, neither a mold nor a filament assembly, one of a mold and a filament assembly, or both a mold and a filament assembly may be disposed on the second mold support when it is in the second position and/or when it is in the third position (e.g., as shown in FIG. 10C-FIG. 10E). It should also be understood that FIG. 10A-FIG. 10G show one exemplary method of using a system with translatable mold supports, but other methods are also possible. For example, certain methods comprise a subset of the steps shown in FIG. 10A-FIG. 10G, such as the steps shown in FIG. 10A-FIG. 10D.

FIG. 10B shows a system 5000 at a point in time after FIG. 10A. In FIG. 10B, the coating process has completed and the deposition chamber has been raised above the second mold support. At this point in time, the second mold support may be translated to the third position (position 830 in FIG. 10B). It should be understood that although FIG. 10B shows first, second, and third positions that are linearly aligned, other embodiments are also contemplated. For example, the three positions may form a 120 degree angle, a 90 degree angle, a 60 degree angle a 45 degree angle, or any other suitable angle.

FIG. 10C shows system 5000 after the second mold support has been translated to the third position and the first mold support has been translated to the second position. At this point in time, as shown in FIG. 10D, the deposition chamber may be lowered onto the first mold support and a mold disposed on the first mold support may be coated. During the coating the process for the first mold disposed on the first mold support, the now-coated second mold may be removed from the second mold support while the second mold support is in the third position. In some embodiments, the filament assembly may be removed from the second mold support while the second mold support is in the third position and while the first mold is being coated. After this step, optionally, a new uncoated mold (e.g., a third mold) may be positioned on the now unoccupied second mold support. The new uncoated mold may, in some cases, be positioned on a mold support lacking a filament assembly. In some embodiments, a new filament assembly may be positioned on the now unoccupied mold support (e.g., in addition to, or instead of, a new uncoated mold), and/or on a mold support lacking a filament assembly (e.g., a mold support comprising a new, uncoated mold but lacking a filament assembly).

Once the first mold has been coated, the second mold support may be translated to the second position and the first mold support may be translated to the first position to begin the process anew. These steps are shown in FIG. 10E-FIG. 10G.

Figure 10H:
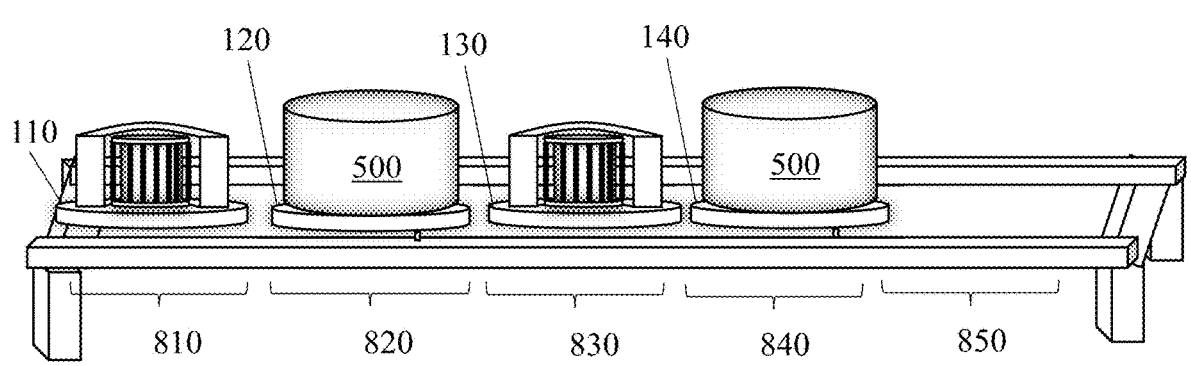

Although FIG. 10A-FIG. 10G depict a system including two mold supports and three positions, it should be understood that further mold supports and further positions may also be possible. In some embodiments, a system may comprise three mold supports and four positions, four mold supports and five positions, or other higher numbers of molds and positions. Two or more of the positions may be suitable for preparing a mold for coating or removing a coated mold; one or more of the positions may be aligned with a deposition chamber and may be suitable for coating a mold. As another example, the system may operate in an assembly line fashion. For example, a system may include five positions in a line, three of which are suitable for preparing molds for coating or removing coated molds, and two of which are aligned with deposition chambers and are suitable for coating molds, as shown in FIG. 10H. In FIG. 10H, system 6000 includes first position 810, second position 820, third position 830, fourth position 840, and fifth position 850. In some embodiments, the positions suitable for preparing molds may alternate with the positions suitable for coating the molds. At any point in time, the two positions suitable for coating molds may be employed to coat molds while the two of the three positions suitable for preparing molds for coating or removing coated molds may be used to do one or both of those tasks. Similarly, for systems with larger numbers of positions, some or all of the positions suitable for coating molds may be employed to coat the molds while a subset of the positions suitable for preparing molds for coating or removing coated molds (e.g., all but one of the positions suitable for preparing molds for coating or removing coated molds) may be used to do one or both of these tasks. In this manner, multiple molds may be coated and prepared at once in a continuous or a semi-continuous process.

In some embodiments, one or more methods may be performed by employing the systems described herein. For example, a conformal coating may be formed on a mold by flowing a gaseous species parallel to a plurality of filaments in a filament array. A conformal coating comprising a reaction product formed from the gaseous species, such as a polymer, may be deposited onto the mold to form a conformally-coated mold. In some embodiments, methods for forming coatings described herein may use at least 50% less precursor than other methods for forming coatings.

In some embodiments, coatings may comprise or be formed of a polymer, such as polytetrafluoroethylene (PTFE), and/or may be very thin (e.g., 50 microns or less). The coatings may facilitate the release of articles formed in the mold and may also reduce, or eliminate, the buildup of contaminants on mold surfaces during processing which, thus, increases mold lifetime. In some embodiments, the coatings may be formed by polymerizing the gaseous species. One or more of an initiated chemical vapor deposition (i-CVD) process, a physical vapor deposition process, and a spray coating process may be employed to deposit and/or form the polymer. Non-limiting types of suitable chemical vapor deposition processes include hot filament plasma processes, pulsed plasma processes, remote plasma processes, ALCVD, thermal CVD, MOCVD, VPE, and PICVD. Non-limiting examples of suitable physical vapor deposition processes include sputtering, non-reactive ALD, electron beam evaporation, cathode arc evaporation, laser evaporation, and sublimation. The process conditions during coating formation may be selected to enable formation of uniform, conformal coatings, even on mold portions including mold features having small widths and/or high aspect ratios. The coatings are particularly well suited to be used in connection with rubber tire molds, though also can be used in other types of molds and other types of articles.

In some cases, the coating may be formed of any suitable polymeric material. Examples of coating materials include polymeric materials such as fluorocarbon polymeric materials (e.g., PTFE), polyoxymethylene, crosslinked siloxanes, vinyl polymers (e.g., methacrylates, acrylates, styrenic polymers) and co-polymers of these materials. Suitable coating material compositions have been described, for example, in U.S. Pat. No. 5,888,591 which is incorporated herein by reference in its entirety.

In some embodiments, it may be particularly preferred for the coating material to comprise one or more fluorine-containing monomers, and/or to comprise PTFE. Fluorine- and PTFE-coating materials may be particularly well-suited in providing the above-described advantages including increasing lubricity (e.g., by reducing coefficient of friction of mold surface), enhancing release from the mold surface, reducing the formation of contamination on mold surfaces, enhancing chemical resistance, and/or lowering surface energy. For example, in these embodiments, the compositional $CF_2$ fraction (i.e., atomic fraction) of the coating material may be at least about 50%; in some cases, at least about 75%; in some cases, at least about 90%; and, in some cases, at least about 95%. In some of these embodiments, the fluorine to carbon ratio (F/C ratio) is between about 1.1/1 to 2.2:1. In some cases, the coating material consists essentially of PTFE, or consists of PTFE. In some embodiments, the coating material compositions (e.g., PTFE compositions) are formed during deposition and do not need to undergo additional steps (e.g., curing) to form the final composition. Thus, these coating materials may be un-cured.

The coating may have any suitable thickness, though in certain embodiments, it is preferable that the coating is very thin. For example, the coating may have a thickness of less than 50 microns. In some embodiments, it is preferable that the coating be even thinner. For example, the coating may have a thickness of less than 25 microns; a thickness of less than 10 microns; a thickness of less than 5 microns; a thickness of less than 2 microns; and, even, a thickness of less than 1 micron. In some cases, it may be preferable for the coating to have a thickness of greater than 10 nm (or greater than 100 nm), for example, to ensure sufficient coverage. It should be understood, however, that other thicknesses may be suitable.

Advantageously, coating methods as described herein can provide coatings that strongly adhere to mold surfaces. Such adherence enhances the ability to coat mold features having small cross-sectional widths and/or high aspect ratios.

In some embodiments, it is preferable that the coating be formed on substantially the entire mold surface area. That is, substantially all of the area of the mold surfaces that defines the mold cavity is coated. However, in certain embodiments, only a portion of the mold surface is coated.

The processes described herein include certain initiated chemical vapor deposition (iCVD) processes. iCVD processes have been described in U.S. Pat. No. 5,888,591 which is incorporated herein by reference in its entirety. In general, iCVD processes have different process steps than other conventional CVD processes which may involve heating the substrate which is coated (e.g., the mold) and/or a plasma to generate reactive species, amongst other differences. One advantage of the iCVD process is that the process does not involve "line-of-sight" deposition and that, instead, reactive species are free to penetrate and conform to small features. iCVD processes are also very well suited to form polymeric material coatings, and in particular the PTFE material coatings described above.

The feed gas composition depends on the composition of the coating being deposited. When forming a fluorocarbon polymeric material, such as PTFE, suitable feed gases include those that decompose (or pyrolyze) to form fluorocarbon (e.g., $CF_2$) monomer units. Examples of feed gases that decompose to form $CF_2$ monomer units include $C_3F_6O$ (HFPO or hexafluoropropylene oxide), $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes such as $CF_2Br$, $CF_2HBr$, $CF_2HCl$, $CF_2Cl_2$ and $CF_2FCl$, difluorocyclopropanes such as $C_3F_6$, $C_3F_4H_2$, $C_3F_2Cl_4$, $C_2F_3Cl_3$ and $C_3F_4Cl_2$, trifluoromethylfluorophosphanes such as $(CF_3)_3PF_3$, $(CF_3)_3PF_3$, and $(CF_3)PF_4$; or trifluoromethylphosphino compounds such as $(CF_3)_3P$, $(CF_3)_2P$—$P(CF_3)_2$, $(CF_3)_2PX$ and $CF_3PX_2$, wherein X is F, Cl or H. In some embodiments, it may be preferable to use HFPO feed gas. It is also be possible to use mixtures of the feed gases described above. In some cases, an inert gas (nitrogen, argon) may be added to the feed gas; though, it may be preferable not to add an inert gas to certain feed gases (e.g., HFPO). It should be understood that other feed gases may also be suitable.

The feed gas is introduced into the chamber at a desired flow rate. Suitable flow rates may be between about 0 sccm and 5000 sccm; and, more typically, between about 200 sccm and 5000 sccm. The specific flow rate may depend on a variety of factors including other processing parameters (e.g., chamber pressure), the geometry of the coating apparatus, as well as the desired properties of the coating. During the deposition process, the partial pressure of the feed gas is preferably kept to a sufficiently low level that prevents homogeneous gas-phase reactions, which could form particles in the gaseous environment rather than a coating on the mold surface.

In general, the feed gas is heated to a temperature sufficient to decompose (or pyrolyze) to form the desired monomer units. As noted above, a heat source (e.g., a filament) may be used to heat the feed gas. Typical heat source temperatures are between about 200° C. and about 800° C. In some cases, the heat source temperature is greater than about 350° C. It is generally preferable that the temperature of a filament heat source is set to be less than that which causes thermionic emission from the filament.

In general, the mold surface is maintained at a lower temperature than the heat source and the feed gas. Such temperature conditions promote formation of a coating having the desired characteristics. For example, the mold surface may be maintained at a temperature of less than about 200° C., in some cases, less than about 100° C. In some methods, it may be preferable for the temperature of the mold to be between about 10° C. and about 30° C. (e.g., 20° C.). As noted above, the mold surface may be cooled to achieve such temperature conditions.

The reaction conditions are maintained to provide a coating having the desired thickness and other characteristics. The thickness of the coating may be monitored by a sensor placed within the chamber.

In certain methods, it may be preferable to include a post-deposition annealing step. The annealing step may relieve stress in the coating, passivate dangling bonds in the coating, enhance thermal stability of the coating, amongst other advantages. The annealing step may be performed by heating the coating to a temperature between about 50° C. and 400° C. In some methods, the annealing step may be performed in the presence of air or an inert gas (e.g., nitrogen). The annealing step may be conducted in-situ in the coating apparatus.

In some embodiments, it may be preferable to treat a mold surface prior to coating deposition to promote adhesion of the monomer units. Pre-treatment may include cleaning the mold to remove mold debris, such as by exposing the mold surface to a plasma, exposing the mold surface to high pressure $CO_2$, performing a laser cleaning process, and/or performing a wet sonication process. In some embodiments, a mold surface may be substantially free of debris from prior molding cycles, lubes, oils, greases, and/or other materials that might reduce the adhesion between the coating and the mold. In some embodiments, a mold may be treated by drying the mold, such as by exposure to air and/or exposure to an elevated temperature. In some embodiments, treating the mold surface may comprise spraying an adhesion promoting layer on the mold surface. In some methods, an adhesion promoting layer can be vapor-deposited in situ in the deposition chamber prior to deposition of the coating (e.g., fluorocarbon). Examples of suitable adhesion promoters include 1H,1H,2H,2H-Perfluorodecyltriethoxysilane; 1H,1H,2H,2H-Perfluorooctyltriethoxysilane; 1H,1H,2H,2H-Perfluoroalkyltriethoxysilane; perfluorooctyltriclorosilane; and all classes of vinyl silanes. It should be understood that other adhesion promoters known to those skilled in the art may also be suitable. In some embodiments, it may be desirable not to have an adhesion promoting layer and that the coating is deposited directly on the mold surfaces.

Example 1

This Example compares the amount of time in which a coating may be deposited on a surface of a mold when employing a system described herein comprising two translatable mold supports to the amount of time required to deposit a coating on a surface of a mold when employing a system lacking translatable mold supports.

A system for depositing a coating on a surface of a mold described herein comprising two translatable mold supports was employed to remove a coated mold and then deposit a coating on a surface of an uncoated mold. The entire process took 112.5 minutes. Each step performed and the amount of time it took are listed below in Table 1. The steps are listed in the order in which they were performed.

TABLE 1

| Step | Time |
| --- | --- |
| Open chamber | 45 seconds |
| Move coated mold to load position | 30 seconds |
| Move uncoated mold to process position | 30 seconds |
| Close chamber | 45 seconds |
| Pump down, coat uncoated mold, and then vent the system | 110 minutes |

A system lacking translatable mold supports was used to perform the same process. The system lacking translatable mold supports does not allow an operator to prepare one mold to be coated while another mold is being coated, and so, when operated continuously, requires that both a previously-coated mold be removed from the system and an uncoated mold be prepared for coating prior to coating the uncoated mold. The entire process took 128 minutes on the system lacking translatable mold supports. Each step performed and the amount of time it took are listed below in Table 2. The steps are listed in the order in which they were performed.

TABLE 2

| Step | Time |
| --- | --- |
| Open chamber | 1 minute |
| Remove filament | 1 minute |

TABLE 2-continued

| Step | Time |
| --- | --- |
| Remove coated mold | 7 minutes |
| Load uncoated mold | 7 minutes |
| Load filament | 1 minute |
| Close lid | 1 minute |
| Pump down, coat uncoated mold, and then vent the system | 110 minutes |

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system for depositing a coating onto a surface of a mold, comprising:
    a deposition chamber;
    a mold support adapted and arranged to support the mold in the deposition chamber;
    a gas inlet port adapted and arranged to introduce a gaseous species into the deposition chamber; and
    a filament assembly, wherein the filament assembly comprises:
        a first frame portion;
        a second frame portion;
        a third frame portion positioned between and connecting the first frame portion and the second frame portion; and
        a plurality of filaments extending between the first frame portion and the second frame portion to form a non-planar filament array,
    wherein the filament array is positioned between the third frame portion and the mold support, and wherein the third frame portion is positioned at a distance of between about 0.1 and 5.0 inches away from the filament array,
    wherein each filament in the filament array is positioned at a distance from the third frame portion that is substantially the same,
    wherein the third frame portion is a solid or hollow cylinder, and
    wherein the filaments in the filament array are positioned concentrically around the third frame portion.

2. A system as in claim 1, wherein the mold is a tire mold.

3. A system as in claim 1, wherein the mold is positioned concentrically around the filament assembly.

4. A system as in claim 1, wherein the mold comprises one or more vent ports.

5. A system as in claim 4, wherein the vent ports of the mold are not substantially occluded during deposition of the coating.

6. A system as in claim 1, wherein the deposition chamber is adapted and arranged to be held at a pressure below atmospheric pressure.

7. A system as in claim 1, wherein the deposition chamber is adapted and arranged to be translated vertically.

8. A system as in claim 1, wherein the deposition chamber is adapted and arranged to be positioned around the mold.

9. A system as in claim 1, wherein the system further comprises one or more baffles adapted and arranged to direct the gaseous species to an outlet.

10. A system as in claim 1, wherein the mold support is capable of heating the mold.

11. A system as in claim 1, wherein the mold support is capable of cooling the mold.

12. A system as in claim 1, wherein the mold support is adapted and arranged to be capable of forming a gas-tight seal with the deposition chamber.

13. A system as in claim 1, wherein the filament assembly and the gas inlet are positioned so to cause the gaseous species to flow upwards.

14. A system as in claim 1, wherein the coating comprises a polymer.

15. A system as in claim 14, wherein the polymer comprises one or more fluorine-containing monomers.

16. A system as in claim 1, wherein depositing the coating comprises performing one or more of a CVD process, a PVD process, and a spray coating process.

17. A system as in claim 1, wherein the filaments are configured to provide a uniform elevated temperature in the vicinity of the mold.

18. A system as in claim 1, wherein the filaments comprise one or more highly resistant metals.

19. A system as in claim 1, wherein the filaments are connected to a DC voltage source and an electrical ground.

20. A system as in claim 1, wherein the gas inlet port is positioned beneath the first frame portion and the second frame portion.

21. A system as in claim 1, wherein the filament array, the filament assembly, and the gas inlet port are positioned so to cause the flow of the gaseous species to have a donut-shaped cross-section.

22. A system as in claim 1, wherein the gas inlet port is positioned beneath the mold support and/or passes through the mold support.

23. A system as in claim 1, wherein the third frame portion is positioned at a distance of greater than or equal to 1.0 inch away from the filament array.

\* \* \* \* \*